United States Patent [19]

Ishikawa et al.

[11] Patent Number: 4,896,285

[45] Date of Patent: Jan. 23, 1990

[54] CALCULATION OF FILTER FACTORS FOR DIGITAL FILTER

[75] Inventors: Seiichi Ishikawa; Masaharu Matsumoto; Katsuaki Satoh; Akihisa Kawamura, all of Osaka, Japan

[73] Assignee: Matsushita Electric Industrial Co., Ltd., Osaka, Japan

[21] Appl. No.: 144,477

[22] Filed: Jan. 15, 1988

[30] Foreign Application Priority Data

| Mar. 23, 1987 | [JP] | Japan | 62-68411 |
| Mar. 30, 1987 | [JP] | Japan | 62-76937 |
| Mar. 30, 1987 | [JP] | Japan | 62-76939 |
| Apr. 2, 1987 | [JP] | Japan | 62-81979 |
| Apr. 2, 1987 | [JP] | Japan | 62-81980 |
| May 8, 1987 | [JP] | Japan | 62-113050 |

[51] Int. Cl.$^4$ ............................................. G06F 15/31
[52] U.S. Cl. .......................... 364/724.01; 364/724.16
[58] Field of Search ................. 364/724.01, 724.13, 364/724.16, 725, 726

[56] References Cited

U.S. PATENT DOCUMENTS 4,535,417  8/1985  Peacock .......................... 364/724.01
4,751,739  6/1988  Serikawa et al. ............... 364/725 X

OTHER PUBLICATIONS

IEEE Transactions on Biomedical Engineering, vol. BME-32, No. 12, Dec. 1985, pp. 1052–1060, IEEE, New York, U.S.; J. A. Van Alste et al.: "Removal of base-line wander and power-line interference from the ECG by an efficient FIR filter with a reduced number of taps".

Agen, No. 9, Jul. 1969, pp. 25–29, Zurich, CH; F. Pellandini et al., "Synthese des filtres digitaux sans contre-reaction".

IEEE Transactions on Acoustics, Speech, and Signal Processing, vol. ASSP-34, No. 6, Dec. 1986, pp. 1529–1541, IEEE, New York, U.S.; A. Dembo et al.: "WMMSE design of digital filter banks with specified composite response".

Electronics Letters, vol. 8, No. 15, 27th Jul. 1972, pp. 380–382, Hitchin, G. B.; G. D. Cain: "Hilbert-transform description of linear filtering".

The Transactions of the IECE of Japan, vol. E 63, No. 8, Aug. 1980, pp. 596–598, Tokyo, JP; S. Shinnaka: "Recursive realizations of N-th order FIR filters with linear phase designed by (N-1) point frequency sampling techniques".

Primary Examiner—Emanuel S. Kemeny
Assistant Examiner—Tan V. Mai
Attorney, Agent, or Firm—Lowe, Price, LeBlanc, Becker & Shur

[57] ABSTRACT

An apparatus for calculating a filter factor for a digital filter which can be simply constructed and in which the time period for calculation can be shortened as compared with conventional techniques. The apparatus has an input circuit for inputting a desirable frequency property, a division circuit for dividing the inputted frequency property into a plurality of frequency bands, and a calculating circuit for obtaining filter factors for realizing a frequency property of each of the divided frequency bands. The input circuit inputs the frequency property with a frequency resolution corresponding to the number of the filter factors. The division circuit performs a correction for a division so that the frequency property becomes zero from a frequency over the high cut-off frequency of a band-pass filter toward the Nyquist frequency of the frequency band corresponding to the transversal filter, the Nyquist frequency being ½ of the sampling frequency. The calculating circuit has a transformation unit for performing a Hilbert transformation or a linear phase transformation with respect to the respective frequency properties divided by the division circuit.

31 Claims, 35 Drawing Sheets

FIG. 1 PRIOR ART
(a)
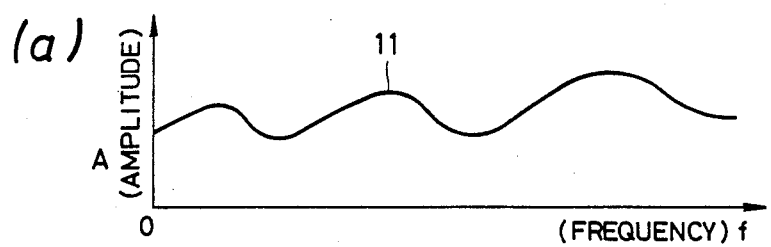
(b)
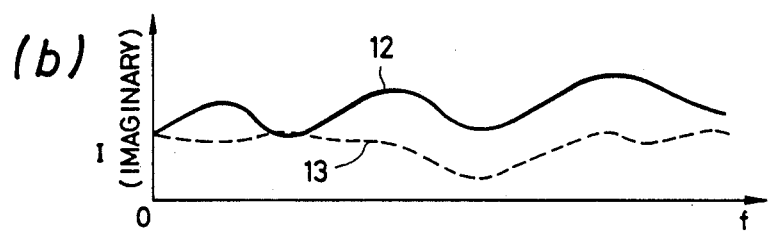
(c)
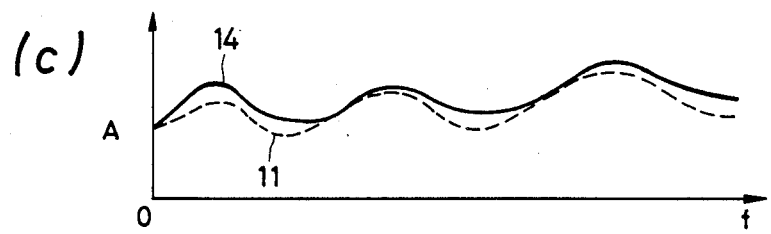

FIG. 4
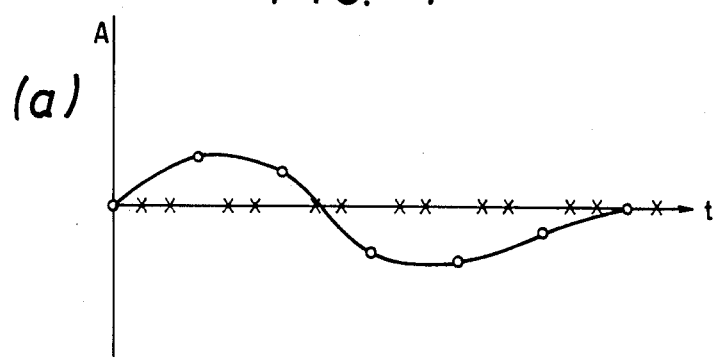
(a)
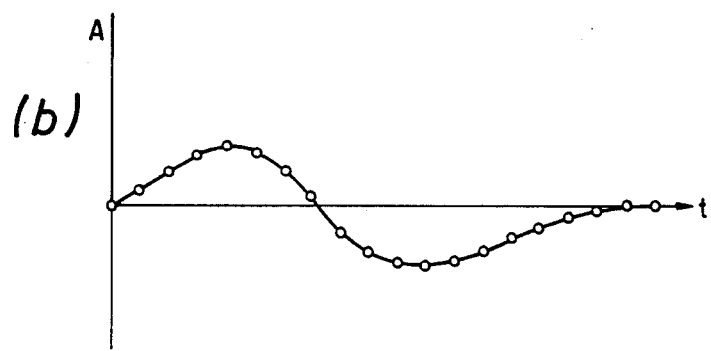
(b)

FIG. 15
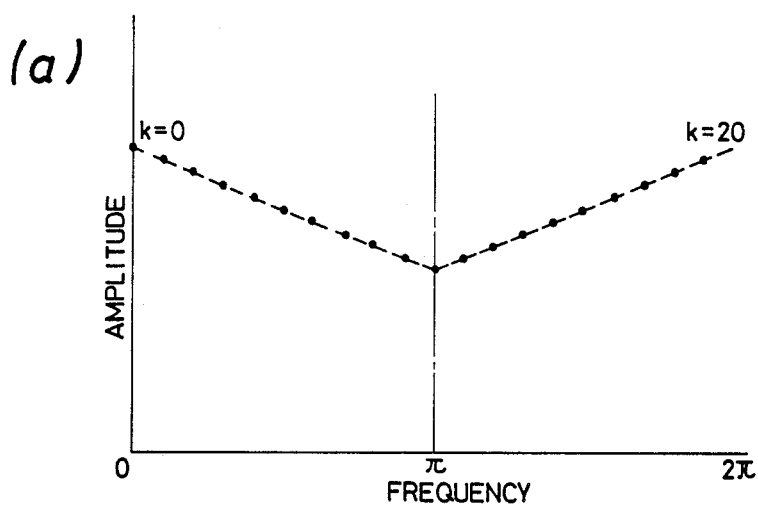
(a)
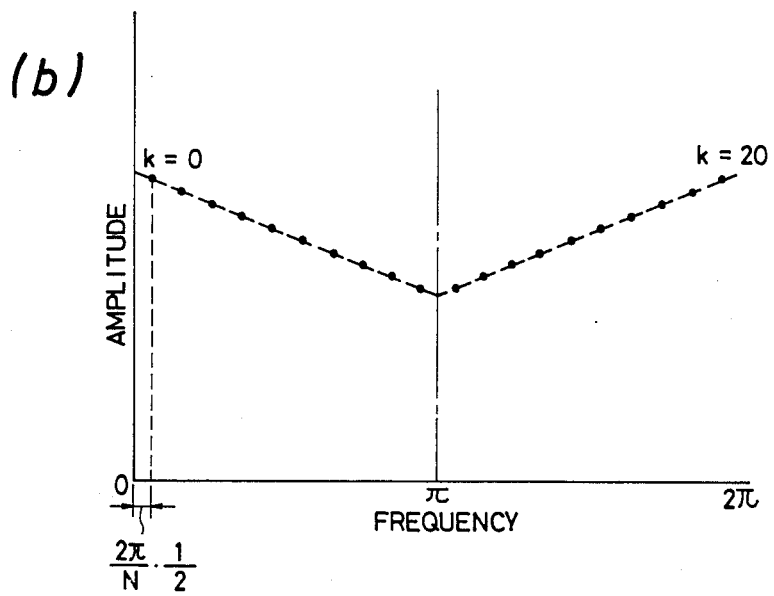
(b)

FIG. 24
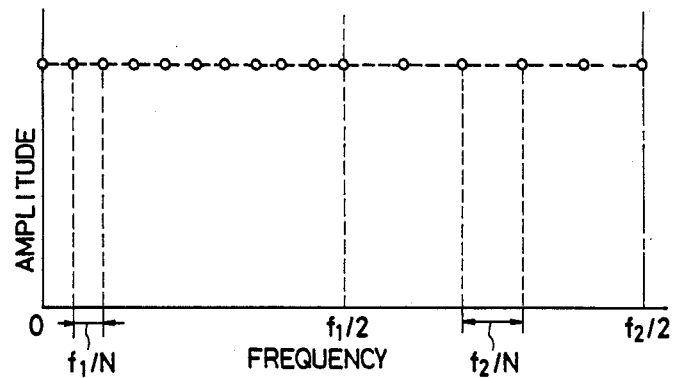
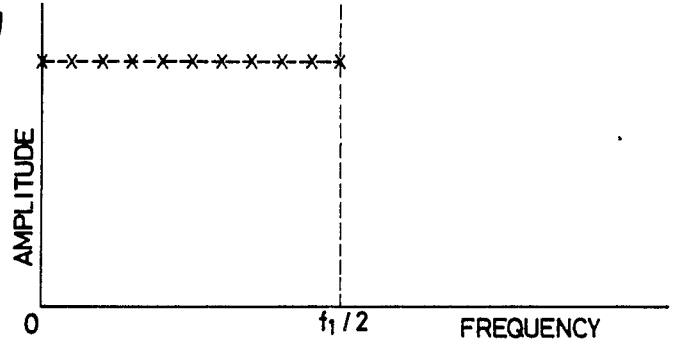
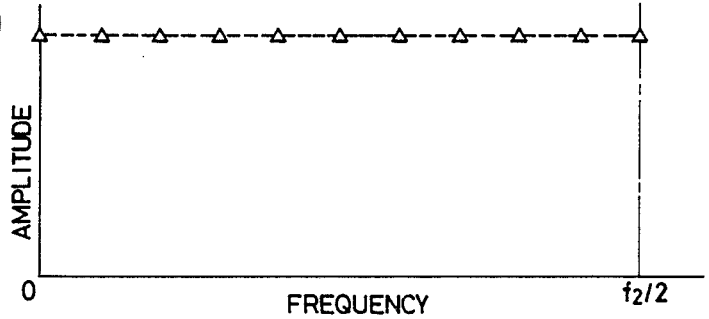

FIG. 26
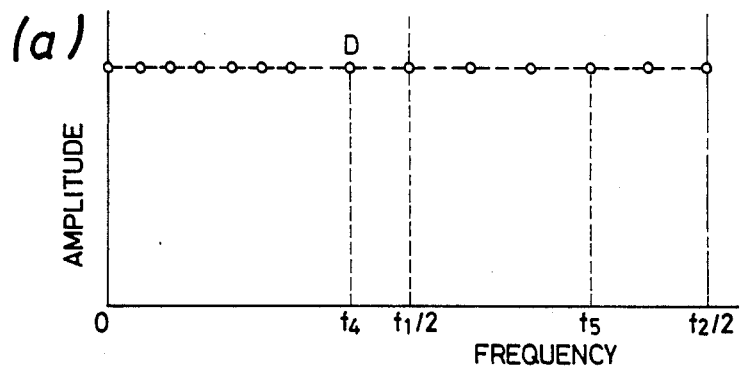
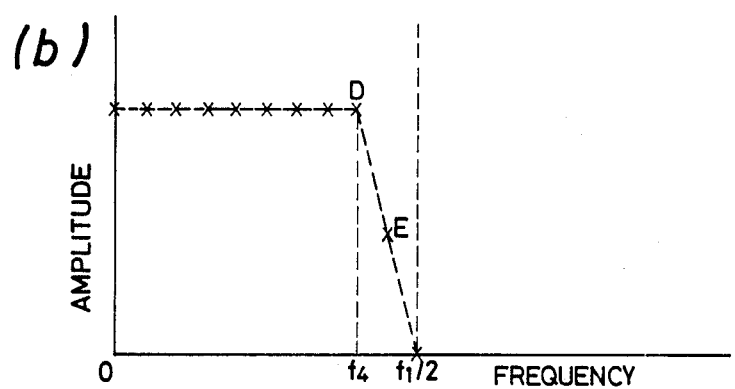
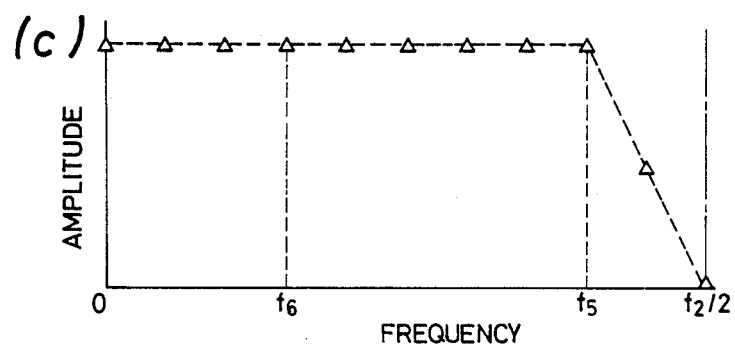

FIG. 32
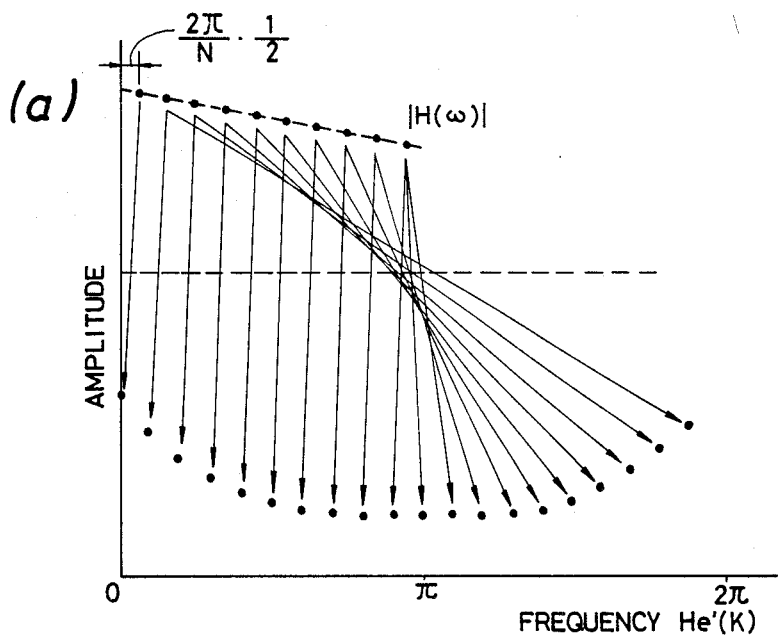
(a)
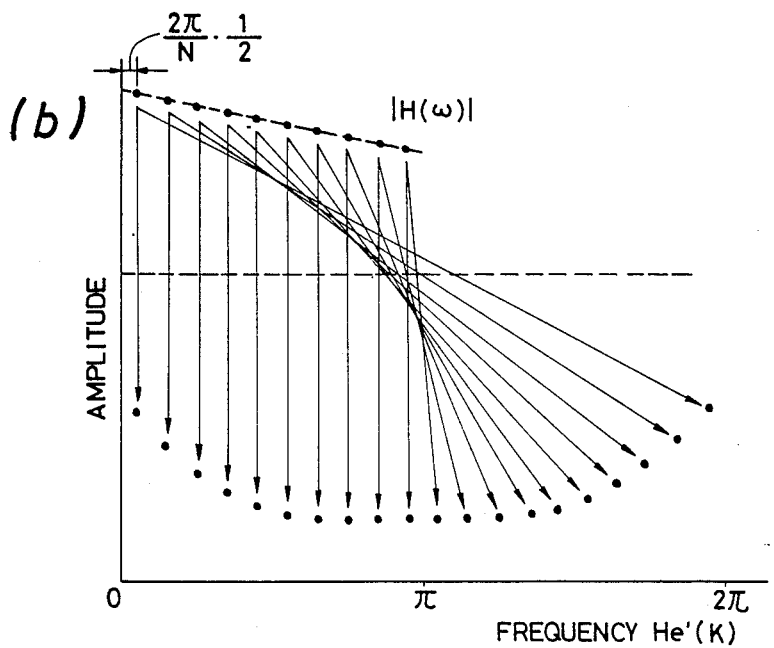
(b)

CALCULATION OF FILTER FACTORS FOR DIGITAL FILTER

BACKGROUND OF THE INVENTION

The present invention relates generally to a transversal filter, or finite impulse response filter, (which will be referred to as FIR filter) for realizing a desirable frequency property (characteristic) by convolution integration of a finite number of factors (which will be referred to as FIR factor) and delayed signals, and more particularly to method and apparatus for obtaining (designing) the FIR factor so as to realize the desirable frequency property.

FIR filters have been employed for various systems such as tone controller for the purpose of arbitrarily obtaining a frequency characteristic. The desirable frequency characteristic obtained thereby is generally expressed by an amplitude-frequency characteristic (power spectrum), which does not contain phase information. Thus, the FIR factor is a time function and cannot be obtained directly by means of the inverse (reverse)-Fourier transformation thereof. One known method for obtaining the phase information from a power spectrum is to use the Hilbert transformation, thereby obtaining a FIR factor for realizing a desirable amplitude frequency property as disclosed in a document (EA85-44) published by Acoustic Academic Society and Electric-Acoustic Society, 1985, for example. This method will be briefly described hereinbelow with reference to FIG. 1. The Hilbert transformation is a method for conversion of a real variable function or imaginary variable function into a complex variable function, as known from "Fundamentals of Digital Signal Processing" published by Ohm-Sha, for example. That is, when an amplitude frequency property is indicated by a solid line 11 in (a) of FIG. 1, assuming the amplitude frequency property as a real variable function, the Hilbert transformation of the real variable function 11 is effected and results in a real variable function as indicated by a solid line 12 in (b) of FIG. 1 wherein a dotted line 13 represents an imaginary variable function. Here, on the contrary, an amplitude frequency property is derived from the complex variable function obtained by the above Hilbert transformation as indicated by a solid line 14 in (c) of FIG. 1. As seen from (c) of FIG. 1, this-obtained amplitude frequency property 14 is different from the desirable frequency property indicated by a dotted line 11 in (c) of FIG. 1. Therefore, on order to reduce the difference therebetween, the desirable frequency property is controlled by a percentage of the difference with respect to the respective frequencies and again Hilbert-transformed to obtain an amplitude frequency property which is in turn compared with the desirable amplitude frequency characteristic. The successive comparison therebetween results in obtaining a complex variable function for a desirable amplitude frequency property usable in practice. A FIR factor can be obtained by the inverse-Fourier transformation of the obtained complex variable function. According to the above-mentioned documents, when the Hilbert transformation is considered as a discrete-time system, the transformation equations are expressed as follows.

$$H(k) = \begin{cases} 1/N \cdot \sum_{m=0}^{N-1} \{P(m) \cdot U_N(k-m)\} \\ \qquad\qquad\qquad\qquad : 0 < k < N-1 \\ 0 \qquad\qquad\qquad : \text{the other } k \end{cases} \quad (1)$$

$$U_N(k) = \begin{cases} N & : k = 0 \\ -j2\cot(\pi/N \cdot k) & : k \text{ (odd number)} \\ 0 & : k \text{ (even number)} \end{cases} \quad (2)$$

where $H(k)$ represents a complex variable function to be obtained and $P(m)$ is a real variable function.

In the Hilbert transformation, the value obtained from the equation (2) can be obtained in advance and stored as a data table.

However, because $P(m)$ in the above equation (1) is varied, operation of sum of products is required for realization of the equation (1), and for performing the Hilbert transformation at the point N, the operation of sum of products is performed at least $N^2$ times. The $N^2$-time operation of sum of products determine the transforming time of the Hilbert transformation and the scale of the transformation-arithmetic unit. Since the transforming time thereof and the unit scale are dependent upon the frequency band and frequency resolution, difficulty is encountered to achieve the reduction thereof.

Furthermore, the second-mentioned document discloses a method for obtaining phase information from the power spectrum wherein a transformation is effected in terms of linear phase to obtain a FIR factor for realizing a desirable frequency property. That is, when the linear phase transformation is considered in a discrete-time system, the transformation equations are expressed as follows.

$$Hr(k) = A(k) \cdot \cos\{-(N-1)/N \cdot \pi k\} \quad (3)$$

$$Hi(k) = A(k) \cdot \sin\{-(N-1)/N \cdot \pi k\} \quad (4)$$

$Hr(k)$ is a real variable function obtained, $Hi(k)$ is an imaginary variable function also obtained, and $A(k)$ represents an amplitude frequency property.

However, in the equations (3) and (4), even if $\cos\{-(N-1)/N \cdot \pi k\}$ and $\sin\{-(N-1)/N \cdot \pi k\}$ can be obtained in advance, multiplication must be made at least N.2 times in the case of performing the linear phase transformation at the point N. The N.2-time multiplication determines the transforming time of the linear phase transformation. The linear-phase transformation time depends upon the frequency band and frequency resolution determined, resulting in difficulty of the reduction thereof.

SUMMARY OF THE INVENTION

The present invention has been developed in order to remove the above-mentioned drawbacks inherent to the conventional techniques.

It is therefore an object of the present invention is to provide new and improved method and apparatus for calculating a filter factor which are capable of reducing the calculation time, the filter-factor calculating apparatus being made with a simple structure.

In accordance with the present invention, there is provided a filter-factor calculating apparatus for a transversal filter, comprising: inputting means for inputting a desirable frequency characteristic; division means coupled to said inputting means for dividing the inputted frequency characteristic into a plurality of frequency bands; and calculating means coupled to said division means for obtaining filter factors for realizing a frequency characteristic of each of the divided frequency bands.

In accordance with the present invention, there is further provided a filter-factor calculating and setting method comprising the steps of: inputting an amplitude frequency property with a first kind or second kind sampling frequency by means of an inputting circuit; obtaining a transfer function in accordance with a combination of the first kind sampling frequency and the second kind sampling frequency using the relation of the Hilbert transformation on the basis of the inputted amplitude frequency property; when the amplitude frequency property is set to said inputting circuit with the first kind sampling frequency, performing the inverse-Fourier transformation of the transfer function with the second kind sampling frequency and, when the amplitude frequency property is set thereto with the second kind sampling frequency, performing the inverse-Fourier transformation of the transfer function with the first kind sampling frequency, so as to obtain an impulse response; and setting the real number portion of the obtained impulse response as a filter factor to an external transversal filter.

In accordance with the present invention, there is further provided a filter-factor calculating and setting method comprising the steps of: inputting an amplitude frequency property with a first kind or second kind sampling frequency by means of an inputting circuit; obtaining a transfer function on the basis of the inputted amplitude frequency property; when the amplitude frequency property is set to said inputting circuit with the first kind sampling frequency, performing the inverse-Fourier transformation of the transfer function with the second kind sampling frequency and, when the amplitude and frequency property is set thereto with the second kind sampling frequency, performing the inverse-Fourier transformation of the transfer function with the first kind sampling frequency, so as to obtain an impulse response; and setting the real number portion of the obtained impulse response as a filter factor to an external transversal filter.

BRIEF DESCRIPTION OF THE DRAWINGS

The object and features of the present invention will become more readily apparent from the following detailed description of the preferred embodiments taken in conjunction with the accompanying drawings in which:

FIG. 1 is a graphic diagram showing a frequency property based on the Hilbert transformation of an inputted desirable frequency characteristic;

FIG. 4 is a graphic diagram showing the sampling frequency transformation by the zero point insertion and band-filter;

FIG. 15 is an illustration of sampling points of amplitude frequency properties;

FIG. 24 shows the input frequency property and divided frequency property in the tenth embodiment;

FIG. 26 is a graphic diagram for describing a correction of the division frequency property;

FIG. 32 is a graphic illustration for expressing the producing state of an amplitude frequency property;

DETAILED DESCRIPTION OF THE INVENTION

Figure 2:
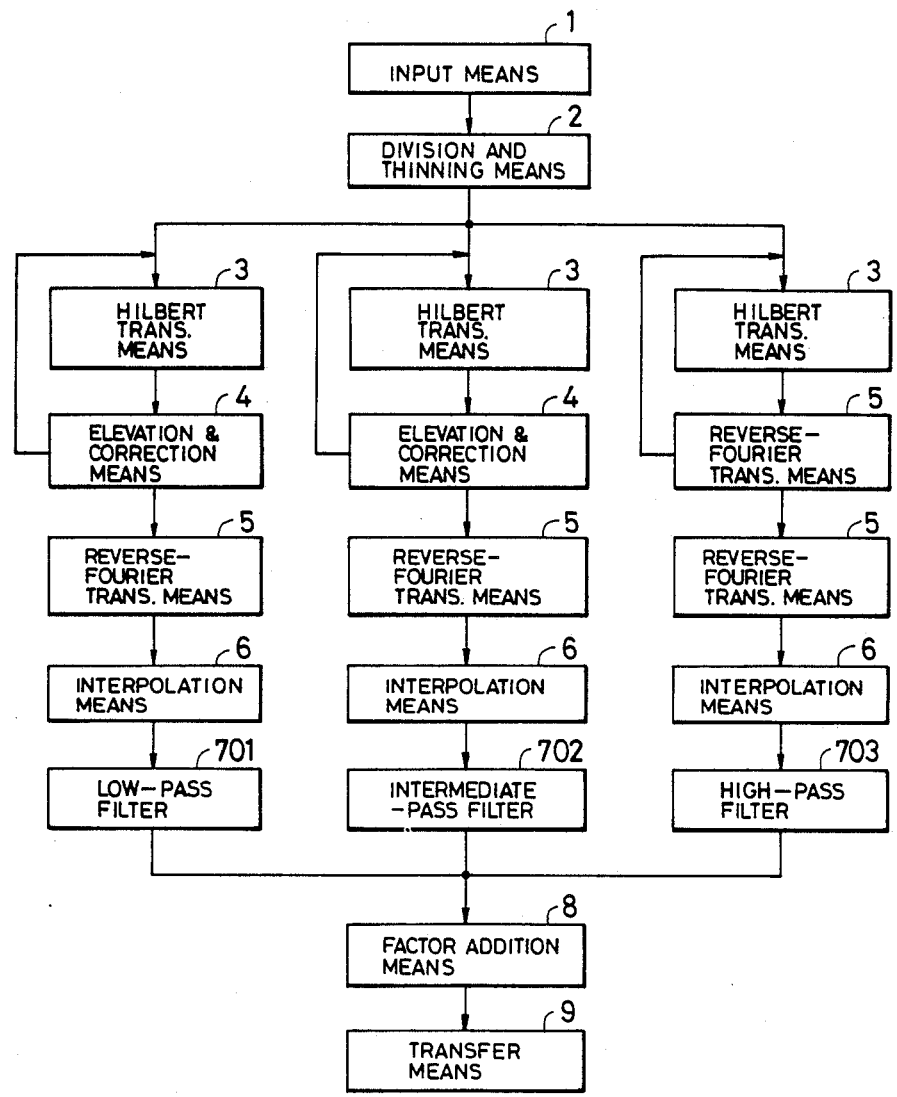
FIG. 2 is a block diagram showing a Filter-factor calculating apparatus according to a first embodiment of the present invention.
Figure 3:
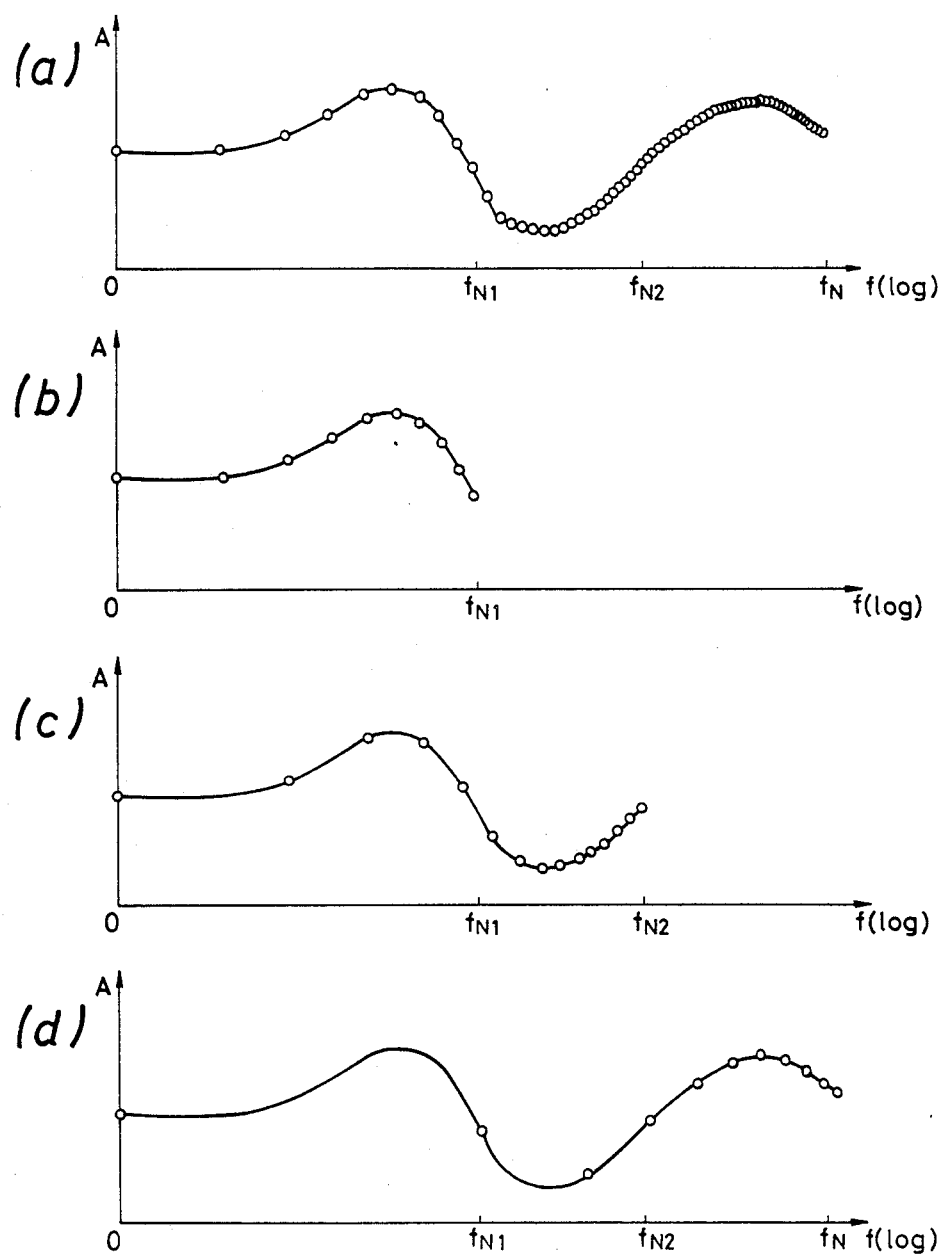
FIG. 3 is an illustration for describing the division of a desirable frequency property.

Referring now to FIG. 2, there is illustrated an arrangement of a FIR-factor calculating unit according to a first embodiment of the present invention which is employed for FIR filters. The FIR-factor calculating unit may be arranged to partially include a microcomputer comprising a central processing unit (CPU), memories and so on. In FIG. 2, illustrated at the reference numeral 1 is an input unit for inputting a desirable frequency property (characteristic) to be realized by the FIR filter. The input unit 1 is connected to a division-and-thinning unit for dividing the inputted frequency property into a plurality of bands (in this case, three bands) and thinning the input point to express the properties of the divided bands with less points. Here, as shown in (a) in FIG. 3, the desirable frequency characteristic is discretely and curvedly indicated by a plurality of points and the interval of the frequencies is determined in accordance with the frequency resolution of the low region of the desirable frequency property. FIG. 3(b) to FIG. 3(d) respectively shows three bands divided by the division-and-thinning unit 2. In FIG. 3(a) to FIG. 3(d), the reference characters $f_{N1}$, $f_{N2}$ and $f_N$ are respectively the highest frequencies of the divided bands, i.e., so-called Nyquist frequencies in digital signal theory, whose values are $\frac{1}{2}$ of the sampling frequencies.

Figure 5:
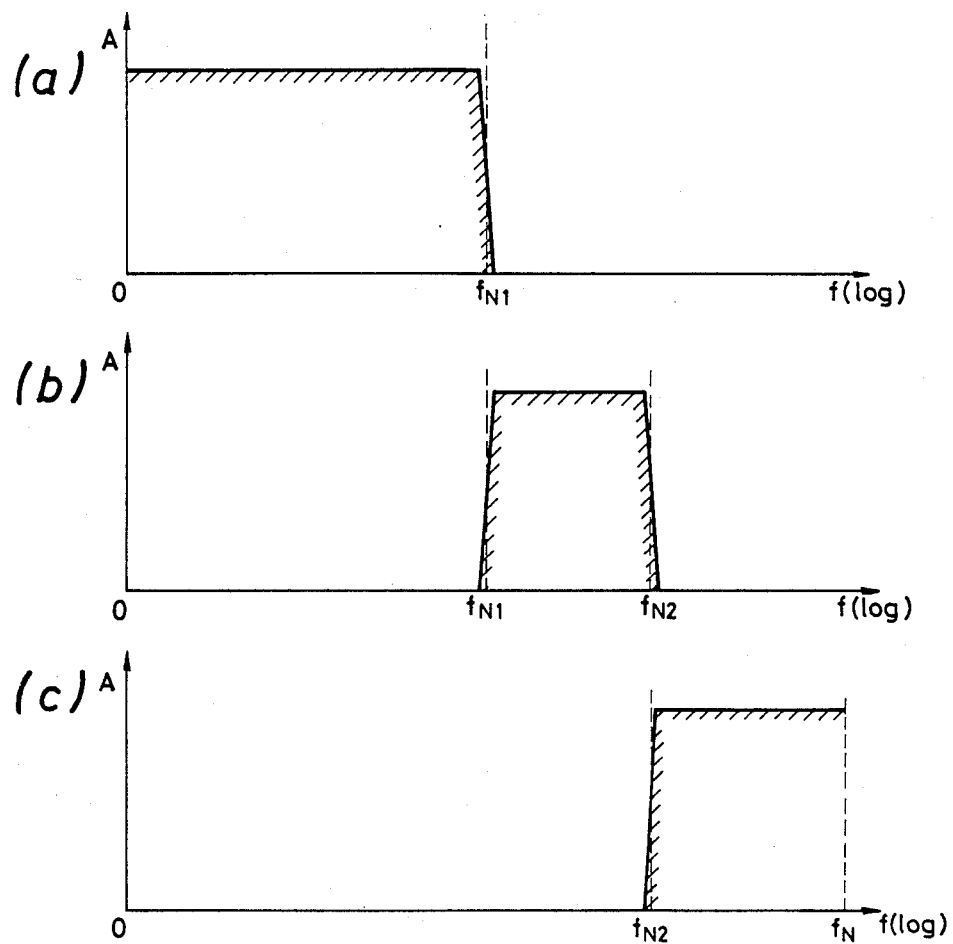
FIG. 5 is an illustration of properties of filters of FIG. 2.

Returning back to FIG. 2, the division-and-thinning unit 2 is coupled to three Hilbert transformation units, illustrated at numeral 3, each of which performs the Hilbert transformation of each of the bands shown in FIG. 3(b) to FIG. 3(d). Each of the three Hilbert transformation means 3 is coupled to each of frequency-property evaluation-and-correction means 4 for checking whether the frequency property after the Hilbert transformation is substantially coincident with the desirable frequency property and, if not substantially coincident therewith, for performing a correction thereof and again returning the corrected result to each of the Hilbert transformation means 3. These means 3 and 4 correspond to the technique disclosed in the first-mentioned document. Each of the frequency-property evaluation-and-correction means 4 is connected to each of inverse-Fourier transformation means 5 wherein the reverse-Fourier transformation is performed using a real variable function and an imaginary variable function obtained by each of the frequency-property evaluation-and-correction means 4. Numeral 6 represents each of interpolation means for performing the interpolation between the sampled points. FIG. 4 is a graphic diagram illustrating one example of the interpolation. As shown in (a) of FIG. 4, zero values are put between the values (o-marks) obtained with the inverse-Fourier transformation at the time points indicated by x-marks. The FIR factors from the respective interpolation means 6 are independently supplied to a low-pass filter 701, an intermediate-pass filter 702 and a high-pass filter 703. In this case, the sampling frequency becomes three times. The characteristics of the respective filters 701, 702 and 703 are respectively illustrated in (a) to (c) of FIG. 5.

Figure 6:
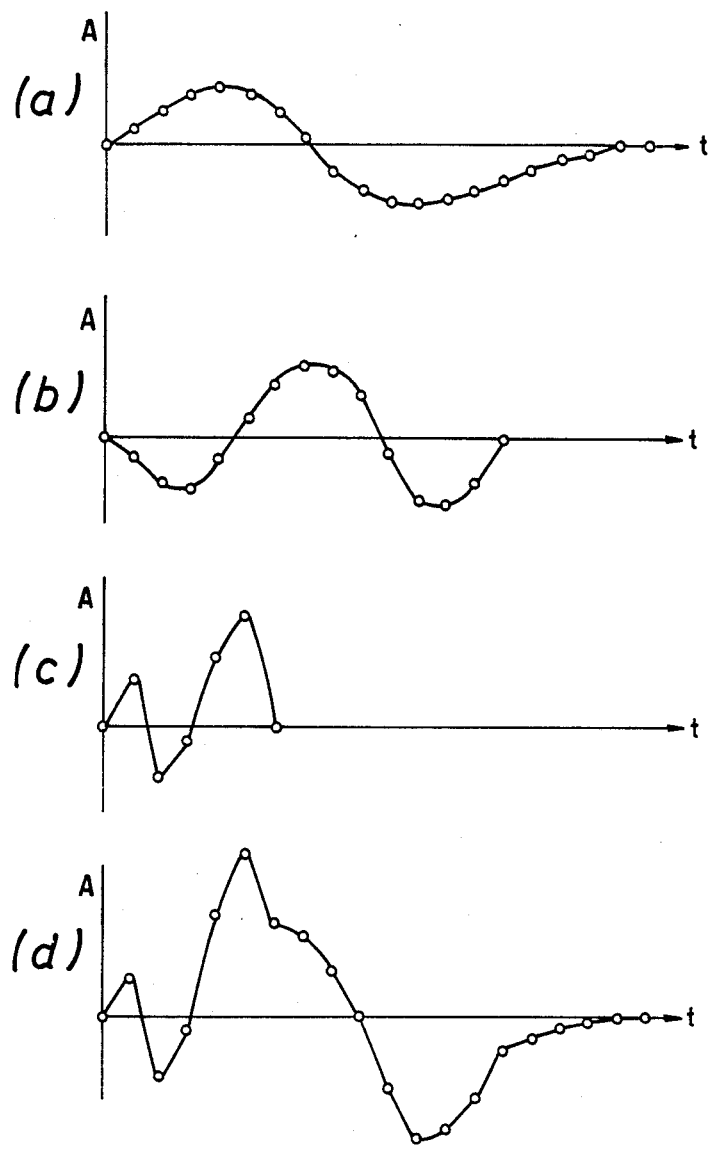
FIG. 6 is an illustration for describing the addition of the outputs of the filters of FIG. 2.

The respective filters 701 to 703 are respectively coupled to a FIR-factor addition unit 8 for summing up the FIR factors obtained with respect to the respective bands. (a) to (c) of FIG. 6 illustrate the FIR factors for realizing the desirable frequency properties at the respective bands which are obtained by the transmission of the results of the sampling frequency transformation into the respective filters 701 to 703. The addition of these FIR factors, as shown in (d) of FIG. 6, causes obtaining the FIR factor for realizing the desirable frequency property with respect to the overall band. The obtained FIR factor for the overall band is transferred by a FIR-factor transferring unit 9 to the FIR filter.

Figure 7:
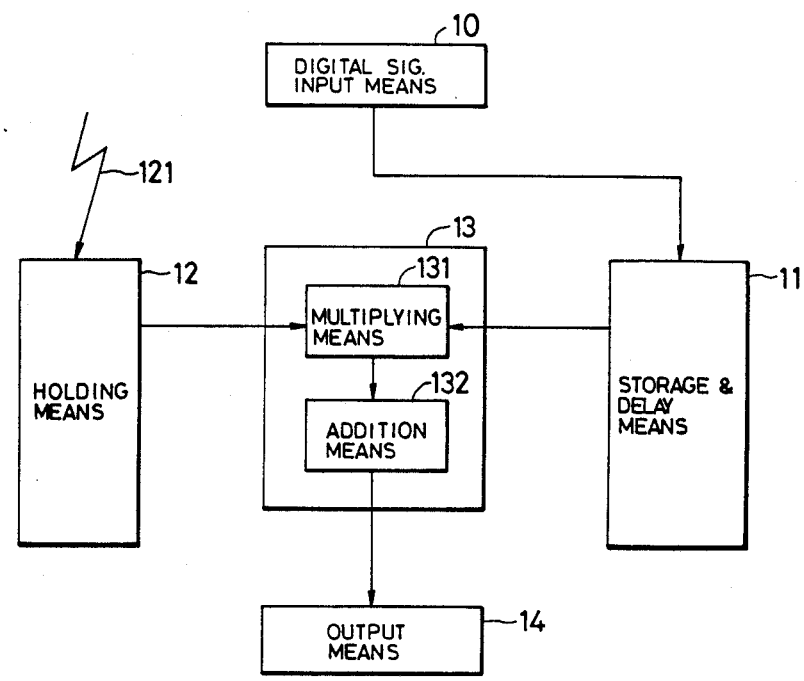
FIG. 7 is a block diagram showing an arrangement of a FIR filter for which the first embodiment may be employed.

FIG. 7 shows one example of FIR filters into which this embodiment is incorporated. In FIG. 7, numeral 10 is an input unit for inputting a digital signal, numeral 11 represents a digital-signal storage-and-delay unit for performing the storage and delay of the input signal for realizing the FIR filter, numeral 12 designates a holding unit for holding the FIR factor transferred through a factor transferring line 121 from this embodiment, numeral 13 is a unit for performing the sum of products which includes a multiplying means 131 and an addition means 132, and numeral 14 represents a digital signal outputting unit for outputting a digital signal processed by the FIR filter.

Figure 8:
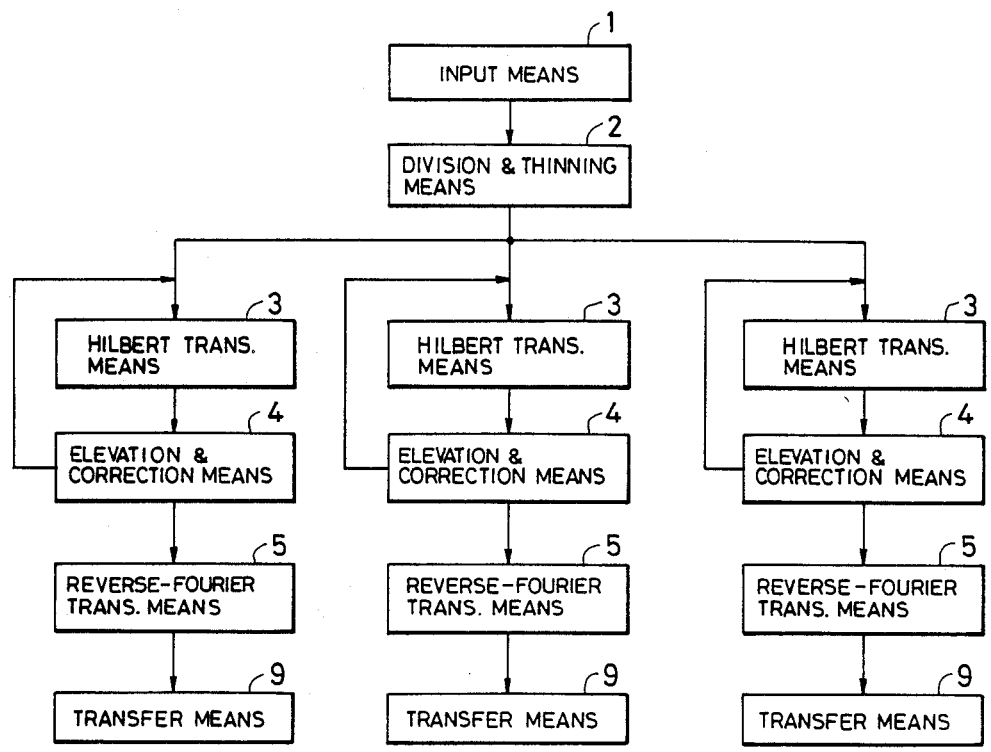
FIG. 8 is a block diagram showing a filter-factor calculating apparatus according to a second embodiment of the present invention.
Figure 9:
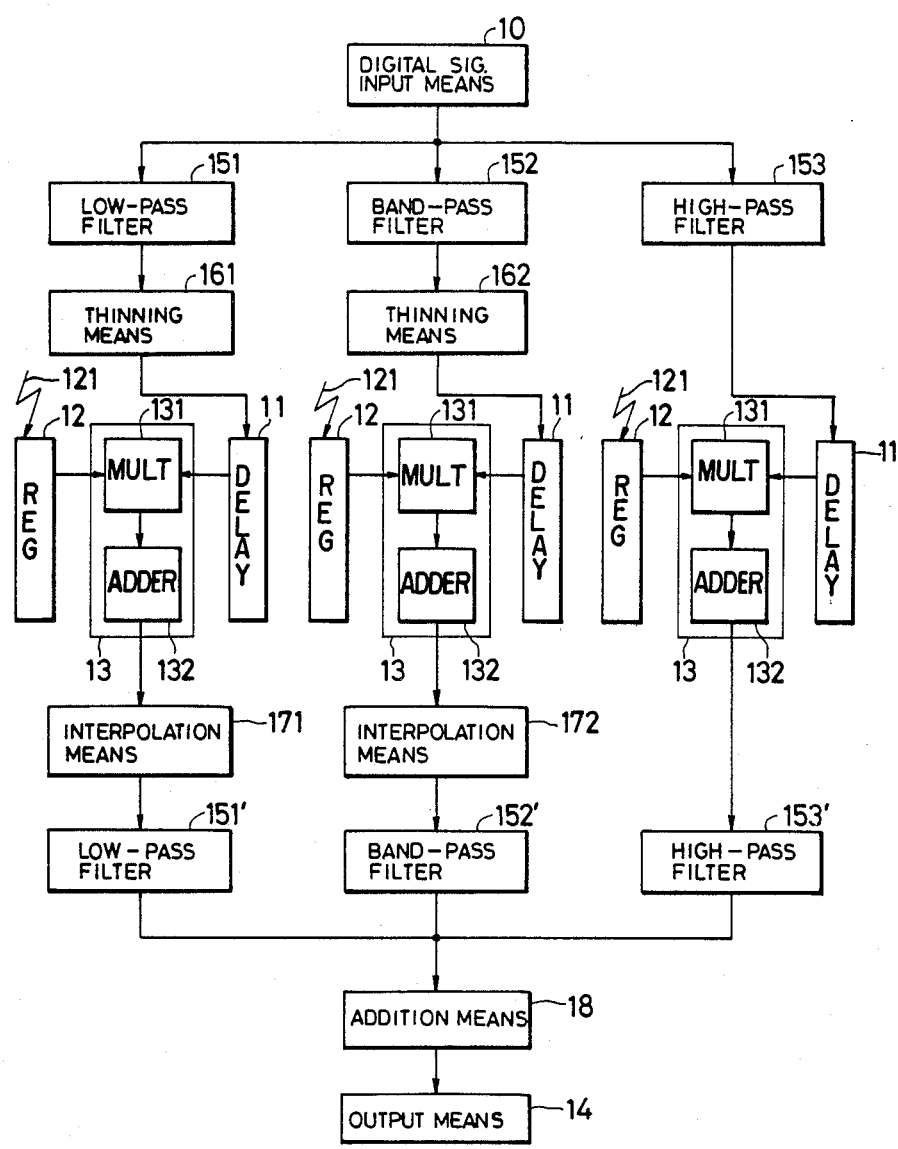
FIG. 9 is a block diagram showing one example of FIR filters in which the second embodiment of the invention may be employed.

FIG. 8 is an illustration of a second embodiment of the present invention in which parts corresponding to those in FIG. 2 are marked with the same numerals and the description thereof will be omitted for brevity. A feature of this second embodiment is to directly transfer the FIR factors obtained with respect to the respective bands. FIG. 9 shows one example of FIR filters into which the second embodiment may be incorporated. In the FIR filter of FIG. 9, a digital signal inputted by an input unit 10 is supplied into low-pass filter 151, intermediate-pass filter 152 and high-pass filter 153 for respectively transmitting predetermined bands and processed so that the sampled points are thinned by thinning units 161 and 162 so as to assume sampling frequencies wherein the limit of each of the respective bands becomes a Nyquist frequency and then treated to perform the sum of products as shown in FIG. 7. Here, each of the FIR-factor holding units 12 receive each of the FIR factors of the respective bands which are transferred from the respective transferring units 9 in FIG. 8. Thereafter, sampling-point interpolation is effected by means of interpolation units 171 and 172 for the signals of the low band and intermediate band in the same manner as in the first embodiment. After transmission into filters 151' to 153' corresponding to the respective band filters 151 to 153, the digital signals reach a digital signal addition unit 18. The sum of the digital signals is outputted from a digital signal outputting unit 14.

As understood from the above description, because an excessive number of data are not required according to the present invention, it is possible to perform operation of sum of products for a shorter time period and to simplify the arrangement of the apparatus.

Figure 10:
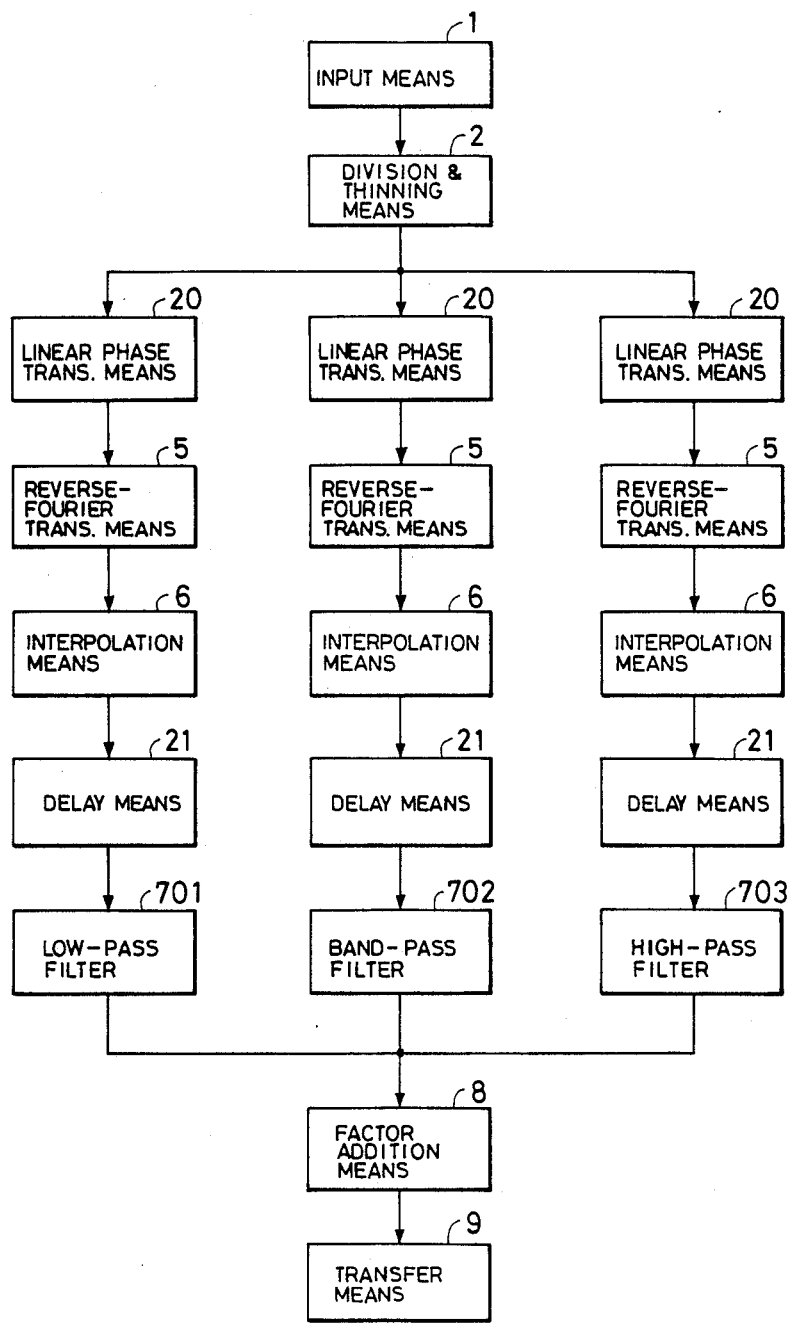
FIG. 10 is a block diagram showing a filter-factor calculating apparatus according to a third embodiment of the present invention.
Figure 11:
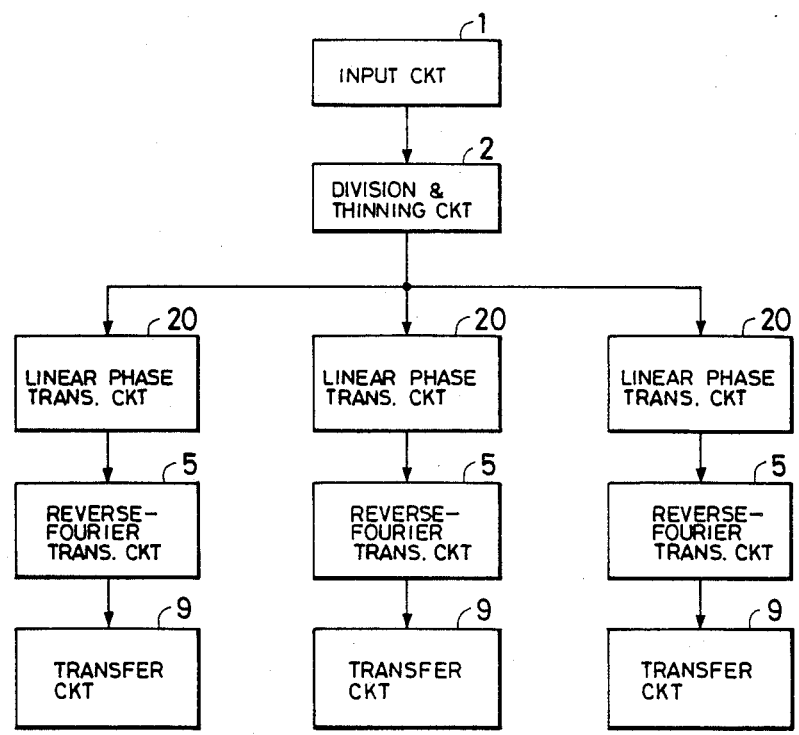
FIG. 11 is an illustration for describing a filter-factor calculating apparatus according to a fourth embodiment of the present invention.
Figure 12:
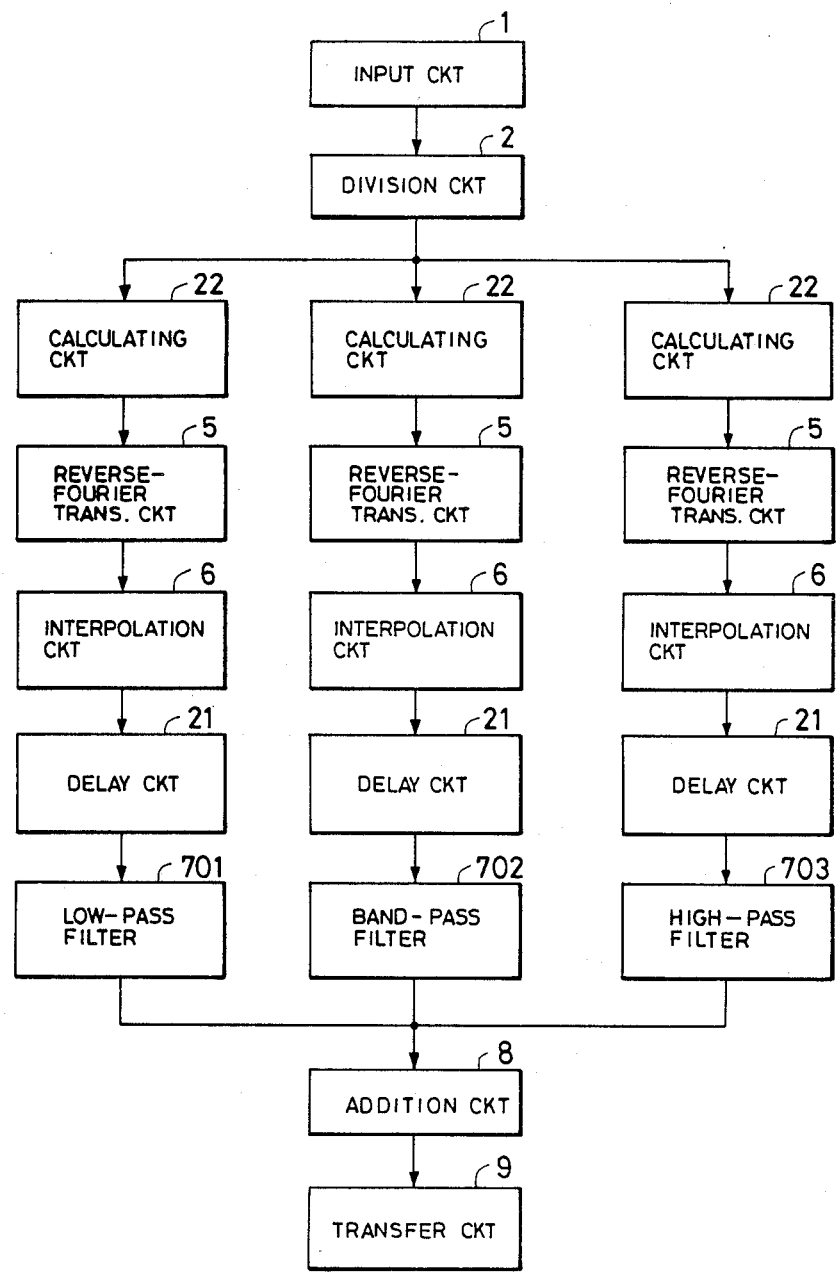
FIG. 12 is an illustration for describing a filter-factor calculating apparatus according to a fifth embodiment of the present invention.
Figure 13:
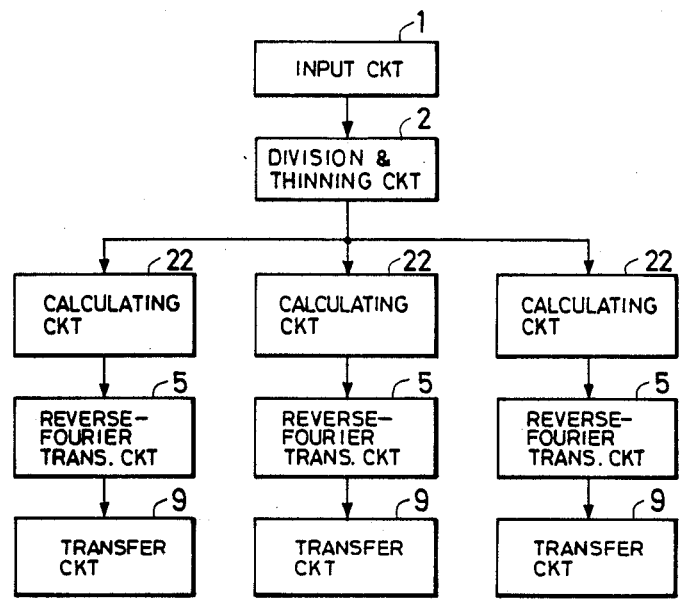
FIG. 13 is an illustration of a modification of the FIG. 12 embodiment.

FIGS. 10 to 13 are illustrations of filter factor calculating units according to third to fifth embodiments of the present invention in which parts corresponding to those in FIG. 2 are marked with the same numerals and the description will be omitted for brevity. A feature of the third embodiment is to obtain a desirable filter factor in accordance with the linear phase transformation. In FIG. 10, numeral 20 represents three linear-phase transformation means for performing the linear-phase transformation of the respective bands shown in (b) to (d) of FIG. 3 to obtain a real variable function and an imaginary variable function. Thereafter, in order to obtain a FIR factor for realizing the desirable frequency characteristic, the inverse-Fourier transformation is performed in each of inverse-Fourier transformation means 5 using the real variable function and the imaginary variable function obtained in each of the linear-phase transformation means 20. After a sampling interpolation is performed in each of interpolation means 6 and then a delay process is made in each of delay means 21 in order to match the centers of the linear-phase factors at the respective bands. This third embodiment may be employed for the FIR filters shown in FIG. 2 or FIG. 7. The fourth embodiment of FIG. 11 is arranged so as to obtain the FIR factors of the respective bands and directly transfer them to the FIR filter. The fourth embodiment may be employed for the FIR filter shown in FIG. 9. A fifth embodiment of FIG. 12 is arranged to obtain a desirable filter factor in accordance with the Hilbert transformation. A difference of this fifth embodiment from the third embodiment is to use, instead of the linear-phase transformation means, arithmetic means 22 for obtaining transfer functions from the respective bands shown in (b) to (d) of FIG. 3 in accordance with the relation to the hilbert transformation. The transfer functions obtained therein are inverse-Fourier-transformed in reverse-Fourier transformation means 5 to obtain a FIR factor for realizing the desirable frequency property. In this case, as shown in FIG. 13, the FIR factors of the respective bands may be directly transferred to a FIR filter.

Figure 14:
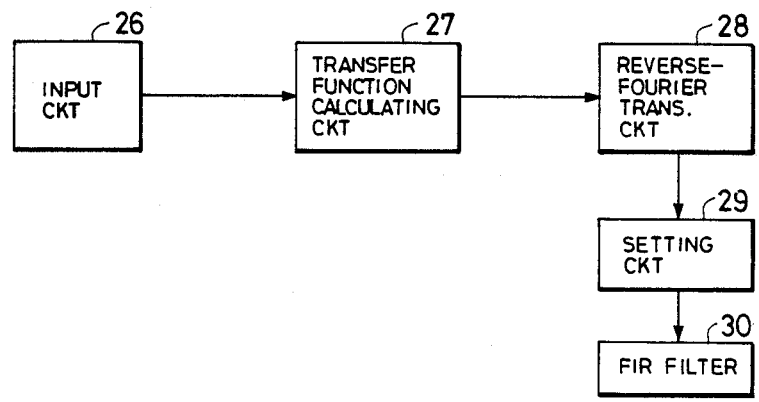
FIG. 14 is a block diagram showing an arrangement of a filter-factor calculating apparatus according to a sixth embodiment of the present invention.

Furthermore, a sixth embodiment of the present invention will be described hereinbelow with reference to FIG. 14. In FIG. 14, illustrated at numeral 26 is an input circuit for inputting a desirable amplitude frequency property at every second kind sampling frequency, which is coupled to a transfer-function calculating circuit 27 for obtaining a transfer function using first kind sampling frequency under the condition of linear phase on the basis of the inputted amplitude frequency property. The first and second kind sampling frequencies are respectively defined in the above-mentioned second document, pages 187 to 188, (will be understood from FIG. 15). The transfer-function calculating circuit 27 is connected to a reverse-Fourier transformation circuit 28 for performing the reverse-Fourier transformation of the obtained transfer function with the first kind sampling frequency. The inverse-Fourier transformation thereof results in obtaining an impulse response whose real number portion is set as a filter factor in a setting circuit 29 which is in turn coupled to a FIR filter for realizing a set amplitude frequency property. In the input circuit 26, a desirable amplitude frequency property $|H(\omega)|$ is set at every second kind sampling frequency (see FIG. 15), and in the transfer-function calculating circuit 27, the following operations are effected to obtain a transfer function $H(\omega)$.

$$H(\omega) = H_R(\omega) + jH_I(\omega) \quad (5)$$

$$H_R(\omega) = |H(\omega)| \cdot \cos(a.2.\pi/N.k) \quad (6)$$

$$H_I(\omega) = -|H(\omega)| \cdot \sin(a.2.\pi/N.k) \quad (7)$$

where $k=0$ to $N-1$ and N is the number of the sampling points and $a=(N-1)/2$. Here, w of the inputted amplitude frequency property $|H(\omega)|$ represents a second kind sampling frequency which is expressed by $\omega = 2\pi/N.\{k+(\frac{1}{2})\} \ldots (8)$, and $\omega$ is the equations (6) and (7) represents a first kind sampling frequency which is expressed by $\omega = 2\pi/N.k \ldots (9)$.

Figure 16:
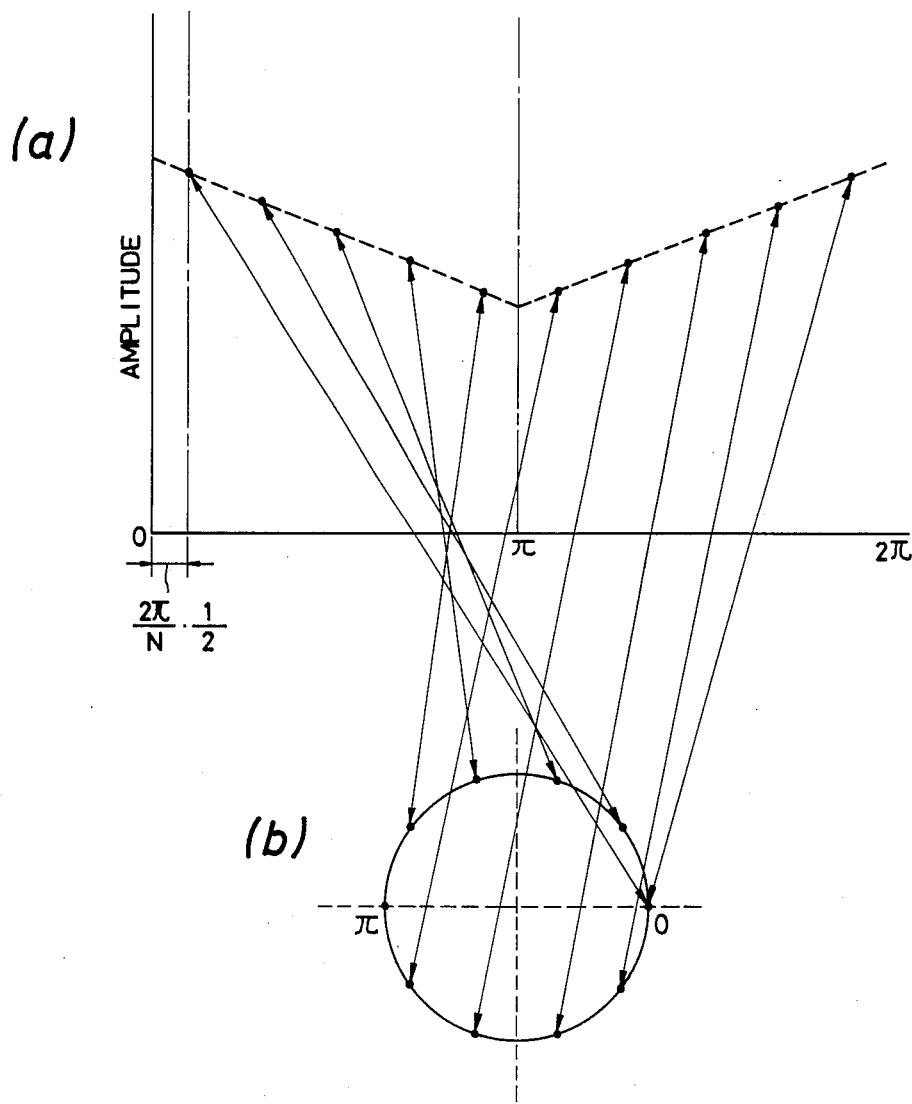
FIG. 16 is an illustration of amplitude frequency properties and sampling points for obtaining a transfer function in the sixth embodiment.

In this case, when the number N of sampling points is even number, until $k=N/2$, $H(\omega)$ is obtained using the equations (6) and (7) as it is. On the other hand, from $k=N/2+1$, k in cos and sin portions assumes $k+1$. However, this is not required when N is great because the result is same. (a) of FIG. 16 shows amplitude frequency properties which is set with second kind sampling frequency and (b) of FIG. 16 is an illustration of first kind sampling frequency in cos, sin of the equations (6) and (7) on the unit circle of complex plane, where arrows show the corresponding relationship of values for performing multification.

From the transfer function $H(\omega)$ thus obtained, in the inverse-Fourier calculating circuit 28, the inverse-Fourier transformation of the following equation (10) is performed using the first kind sampling frequency to obtain an impulse response corresponding to $H(\omega)$.

$$h(n) = 1/N \cdot \sum_{k=0}^{N-1} H(\omega) \cdot e^{j(2\pi/N) \cdot kn} \quad (10)$$

where $0 \leq n \leq N-1$, and $H(\omega)$ is a value obtained in accordance with the above-mentioned equations (5), (6) and (7). Here, $\omega$ in the complex function $e^{jwn}$ is a value which is the result of the first sampling expressed by the equation (9).

Figure 17:
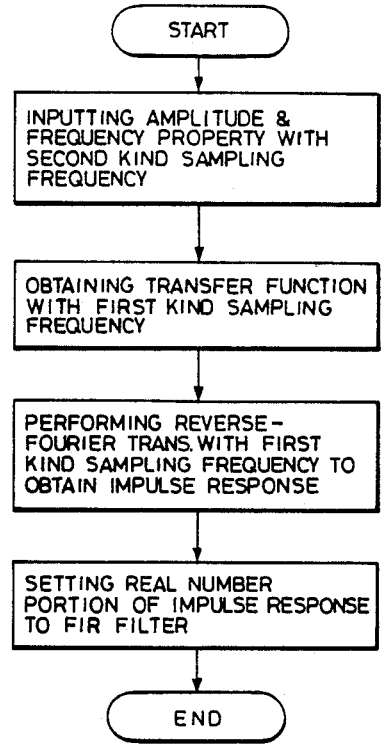
FIG. 17 is a flow chart showing operations of filter-factor calculation.

Thereafter, only the real number portion of the impulse response $h(n)$ obtained in the setting circuit 29 is taken out and set as a filter factor to the FIR filter 30. As a result, without using a window function, the desirable amplitude frequency property inputted here can be realized accurately without occurrence of ripple. FIG. 17 shows a flow chart for a better understanding of the above-described filter factor calculation.

Figure 18:
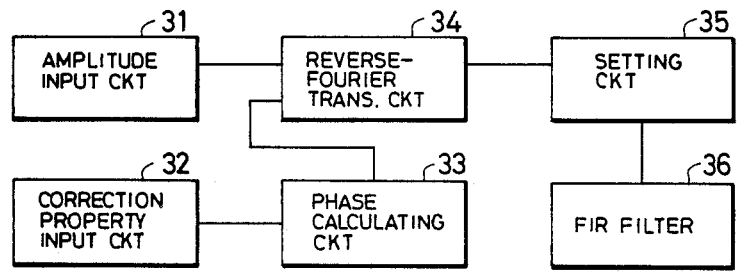
FIG. 18 is a block diagram showing a filter-factor calculating apparatus according to a seventh embodiment of the present invention.

A seventh embodiment of the present invention will be described hereinbelow with reference to FIG. 18. In FIG. 18, illustrated at numeral 31 is an amplitude input circuit for input a desirable amplitude frequency property and illustrated at numeral 32 is a correction property input circuit for inputting the reverse amplitude frequency property of an amplitude frequency property of an object to be phase-corrected (for example, reverse amplitude frequency property of a speaker) or for automatically produce the reverse property of an inputted amplitude frequency property of an object for the phase correction. The correction property input circuit 32 is coupled to a phase calculation circuit 33 for obtaining a phase frequency property on the basis of the amplitude and frequency characteristic inputted therefrom in accordance with the relation of the hilbert transformation. Numeral 34 represents a reverse-Fourier transformation circuit for performing the reverse-Fourier transformation of the transfer function having the amplitude frequency property inputted to the amplitude input circuit 31 and the phase frequency property obtained in the phase calculation circuit 33. The reverse-Fourier transformation circuit 34 is coupled to a setting circuit 35 for setting as a filter factor an impulse response obtained by the reverse-Fourier transformation circuit 34. Numeral 36 is a FIR filter for realizing the actually set frequency property.

Figure 19:
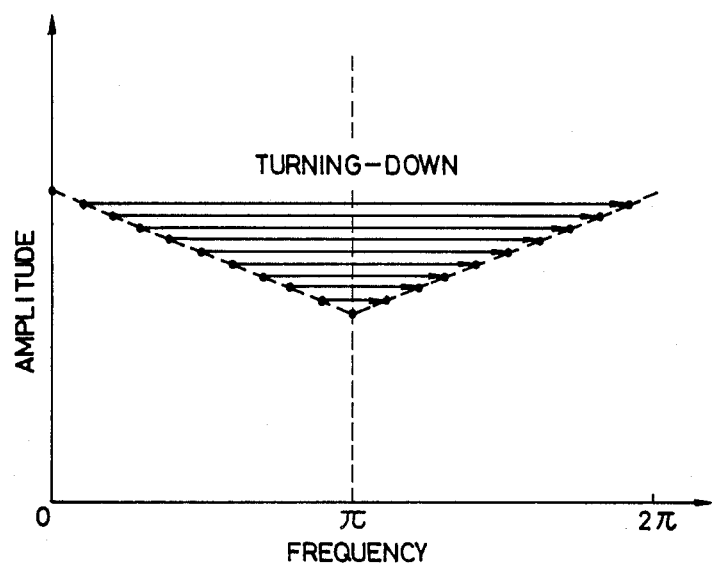
FIG. 19 is an illustration for describing a determining method of an amplitude frequency property.

In the amplitude input circuit 31, when a desirable amplitude frequency property $|H(\omega)|$ of $\omega=0$ to $\pi$, an amplitude frequency property of $\omega=\pi$ to $2\pi$ can be automatically produced by the turning-down of the inputted amplitude frequency property (see FIG. 19). Inputted to the correction property input circuit 32 is the reverse amplitude frequency property $|H1(\omega)|$ of an object to be phase-corrected (for example correction of the phase frequency property of a speaker). Similarly, the amplitude frequency property of $\omega=0$ to $\pi$ is inputted and turned down to produce an amplitude frequency property of $\omega=\pi$ to $2\pi$. In the phase calculation circuit 33, a phase frequency property is calculated using this amplitude and frequency property in accordance with the relationship of the Hilbert transformation. The Hilbert transformation is essentially a method for obtaining a complex variable function on the basis of a given real variable function or imaginary variable function. A period function h(n) (sequence represents a discrete-time system) of a period N is expressed by the sum of an odd function ho(n) and an even function he(n). That is, $$h(n) = he(n) = ho(e) \tag{11}$$

where n=0 to N−1.

Furthermore, when the law of causality is defined as the following equations:

$$h(n) = 0 \quad -N/2 < n < 0 \tag{12}$$

$$h(n) = he(n) \cdot u(n) \tag{13}$$

$$u(n) = \begin{cases} 1 & n = 0, N/2 \\ 2 & n = 1 \text{ to } N/2 - 1 \\ \phi & n = N/2 + 1 \text{ to } N - 1, \end{cases}$$

h(n) can be obtained with he(n).

Here, from the nature of he(n) and ho(n), the following effect can be known. That is, when the Fourier series factor of h(n) is as follows:

$$H(K) = H_R(K) + jH_I(K) \tag{14}$$

where $\omega=(2\pi/N).K$, K=0 to N−1, the Fourier series factor of ho(n) assumes $H_R(K)$ and the Fourier series factor of he(n) assumes $jH_I(K)$.

From the above results, when the above series is assumed as a finite period function of the finite period N, on the contrary, the result of the reverse-Fourier transformation (generally so-called IDFT) of $H_R(K)$ (K=0 to N−1) assumes he(n). The following fact will be known from the above nature.

The transfer function H'(k) for realizing a desirable amplitude frequency property $|H.(K)|$ is expressed as following equation.

$$H'(K) = |H'(K)| \cdot e^{j\theta(\omega)} \tag{15}$$

where $\theta(\omega)$ represents a phase frequency property. when assuming natural logarithm with respect to the both sides of the equation (15), the equation is as follows.

$$lnH'(K) = ln|H'(K)| + j\theta(\omega) \tag{16}$$

Here, when the result of the reverse-Fourier transformation of lnH'(K) is h'(n) and the result of the reverse-Fourier transformation of ln|H'(K)| is h'e(n), from the equation (13), the following equaztion can be obtained:

$$h'(n) = h'e(n).u(n) \tag{17}$$

Furthermore, when performing the Fourier transformation of h'(n) obtained by the equation (17), the real number portion of the obtained value corresponds to $ln|H'(K)|$ and the imaginary number portion thereof corresponds to $j\theta(\omega)$.

Therefore, from the above, the phase frequency property can be obtained from the amplitude frequency property in accordance with the following operations:

(1) assuming natural logarithm of the amplitude frequency property;

(2) performing the reverse-Fourier transformation of the value obtained in (1);

(3) obtaining h'(n) by performing the calculation of the equation (17) on the basis of the value obtained in (2);

(4) performing the reverse-Fourier transformation of h'(n); and (5) taking out the imaginary number portion of the result of the reverse-Fourier transformation of h'(n).

The phase frequency property obtained thus is behaved so that the phase transition becomes the minimum (just like the phase frequency property of sealed type speaker or the like).

Thus, if obtaining the amplitude frequency property $|H1(\omega)|$, the phase frequency property of an object having this amplitude frequency property can be obtained in accordance with the relation of the Hilbert transformation. Therefore, if obtaining the phase frequency property having this amplitude frequency property on the basis of the reverse amplitude frequency property of the object to be phase-corrected, this results in the phase and frequency property for the phase correction. That is, it is possible to obtain the reverse phase property of the object to be phase-corrected.

Subsequently, in the reverse-Fourier transformation circuit 34, on the basis of the amplitude frequency property inputted in the amplitude input circuit 31 and the phase frequency property calculated in the phase calculating circuit 33 is obtained the transfer function $H(\omega)$ which is in turn processed with the reverse-Fourier transformation to obtain the impulse response h(n). This method is more simple and accurate in terms of obtaining h(n) as compared with the technique disclosed in the first-mentioned prior document. In the impulse response thus obtained, the amplitude frequency property expresses the amplitude frequency property inputted by the amplitude input circuit 31 and the phase frequency property expresses the phase frequency property calculated by the phase calculating circuit 33. This will be understood by the following consideration.

Figure 20:
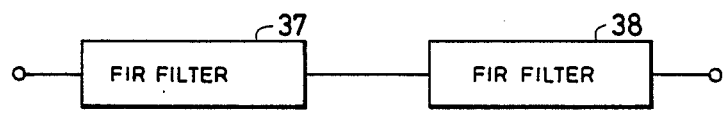
FIG. 20 is a block diagram showing a system having two FIR filters.

It is assumed that a system has two FIR filters as shown in FIG. 20. One FIR filter is arranged, in response to input of a desirable amplitude frequency property, to obtain the phase frequency property $\theta 11(\omega)$ from this inputted amplitude frequency property in accordance with the relation of the Hilbert transformation and to employ, as a filter factor, the result obtained by the reverse-Fourier transformation using the transfer function having this frequency property. Another FIR filter 38 is arranged to employ, as a filter factor, a value obtained by the reverse-Fourier transformation of the transfer function obtained under the condition of linear phase on the basis of the amplitude frequency property which is the sum of a desirable amplitude frequency property $|H12(\omega)|$ and the reverse amplitude frequency property of the amplitude frequency property inputted by the FIR filter 37. Here, the amplitude frequency property is inputted in logarithm and the transfer function may be the amplitude frequency property itself (in this case, the phase item is zero). According to such an arrangement, the amplitude frequency property of the overall system is the amplitude frequency property $|H12(\omega)|$ inputted in the FIR filter 38, and the phase and frequency property thereof assumes $\theta11(\omega)$. Here, actually, the variation of the linear phase of the FIR filter 38 is added. However, this may be disregarded when considering the phase correction. That is, when considering the phase item, the group delay characteristic obtained by differentiating the phase frequency property with frequency is important and therefore the variation of the linear phase can be disregarded.

Therefore, on the contrary, for the overall system, a system comprising one FIR filter having a desirable amplitude frequency property and the phase frequency property obtained in accordance with the relation of the Hilbert transformation corresponds to a system comprising one FIR filter with linear phase and one FIR filter having the relation of the Hilbert transformation (the minimum phase transition system). Thus, h(n) obtained in the reverse-Fourier transformation circuit 34 has a desirable amplitude frequency and a phase frequency property for correction.

Subsequently, the setting circuit 35 sets h(n) thus obtained, as a filter factor, to the FIR filter 36.

In this embodiment, Although the description has been made in terms of phase correction, it is also appropriate that it is possible to realize a phase frequency property of an object having an amplitude frequency property.

Figure 21:
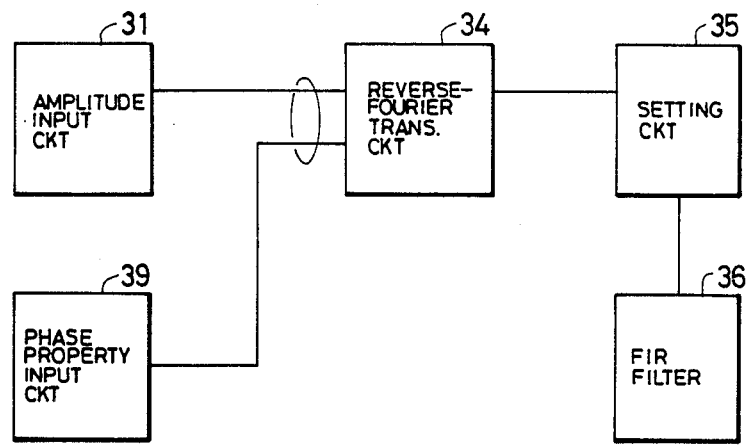
FIG. 21 is a block diagram showing a filter-factor calculating apparatus according to an eighth embodiment of the present invention.

An eighth embodiment of the present invention will be described hereinbelow with reference to FIG. 21 in which parts corresponding to those in FIG. 18 are marked with the same numerals and the description thereof will be omitted for brevity. In FIG. 21, numeral 39 represents a phase property input circuit for inputting a desirable phase frequency property, the phase property to be inputted being $\omega=0$ to $\pi$. The property of $\omega=\pi$ to $2\pi$ is produced by returning-down of $\omega=0$ to $\pi$ after change of positive and negative signs. This is because, when the impulse response to be obtained is a real number, the amplitude frequency property is an even function and the phase frequency property is an odd function. The operation is similar to that of the seventh embodiment of FIG. 18 and the difference with respect thereto is to directly input the phase frequency property. However, in this embodiment, the phase frequency property is based on not only the minimum phase transition but also a desirable phase frequency property. As in the seventh embodiment, the amplitude frequency property to be realized is the desirable amplitude frequency property inputted and the phase frequency property is the result obtained in accordance with the relation of the Hilbert transformation. A filter factor is obtained by the reverse-Fourier transformation using these properties whereby the phase and amplitude can be set independently of each other. From this, it will be understood that the phase frequency property can also be set arbitrarily. For describing this is considered the portion that in the seventh embodiment the phase frequency property is obtained using the relation of the Hilbert transformation. In the seventh embodiment, the phase frequency property is obtained from the reverse amplitude frequency property of an object to be phase-corrected. On the contrary, let it be assumed that, when a phase frequency property is set, an amplitude frequency property corresponding to this can be obtained. In other words, when the obtained amplitude and frequency property is inputted, the set phase frequency property is obtained from the relation of the Hilbert transformation. Thus, a consideration is made that there is an amplitude frequency property corresponding to the desirable phase frequency property.

A further description is made with reference to FIG. 20. As described previously, numeral 37 is a FIR filter for setting a filter factor corresponding to the transfer function obtained from an amplitude frequency property having the set desirable phase frequency property and numeral 38 is a FIR filter wherein the amplitude frequency property is the sum of a desirable amplitude frequency property to be set and the reverse amplitude frequency property of the amplitude frequency property obtained from the phase frequency property of the FIR filter 37. According to this arrangement, as well as in the seventh embodiment, the overall amplitude frequency property assumes the desirable amplitude frequency property set in the FIR filter 38 and the phase frequency property assumes the phase frequency property set in the FIR 37. From this consideration, it will be understood that, according to the arrangement of the eighth embodiment, the amplitude frequency property and the phase frequency property can be set independently from each other.

Figure 22:
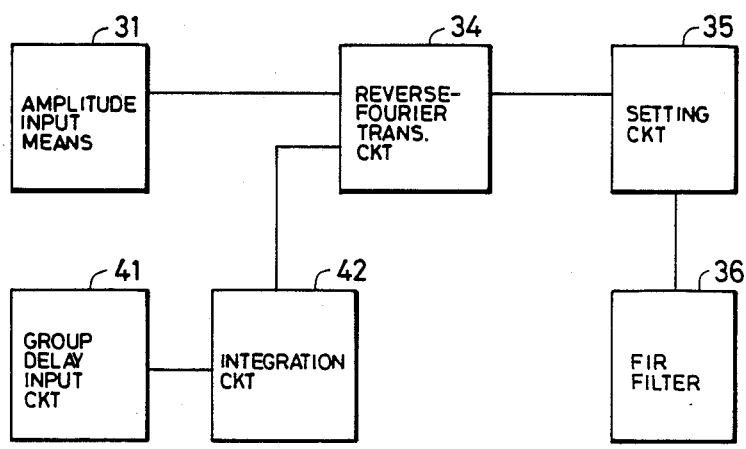
FIG. 22 is a block diagram showing a filter-factor calculating apparatus according to a ninth embodiment of the present invention.

A ninth embodiment of the present invention will be described hereinbelow with reference to FIG. 22 in which parts corresponding to those in FIG. 18 are marked with the same numerals and the description will be omitted for brevity. In FIG. 22, numeral 41 represents a group delay property input circuit for inputting a desirable group delay frequency property or group delay distortion property. The input circuit 41 is coupled to an integration circuit 42 for integrating the inputted group delay property to calculate a phase frequency property. The group delay property $\tau(\omega)$ is defined as follows.

$$\tau(\omega) = d\theta(\omega)d\omega \qquad (18)$$

Therefore, the integration thereof with a frequency $\omega$ results in a phase frequency property $\theta(\omega)$. This means that the phase frequency property can be obtained on the basis of a desirable group delay property. Accordingly, as well as in the seventh and eighth embodiments, the amplitude frequency property and the group delay property (phase frequency property) can be set independently of each other. Although in the seventh, eighth and ninth embodiments the impulse response obtained in the reverse-Fourier transformation circuit 34 is used as a filter factor of the FIR filter as it is, this may produce a ripple in the frequency property realized by the FIR filter. Therefore, for preventing the occurrence of the ripple, the impulse response obtained in the reverse-Fourier transformation circuit 34 is multiplied by a window function having a characteristic such as hanning and hamming and the result of the multification is used as a factor of the FIR filter. Thus, the setting circuit 35 may be arranged to have such a window.

Figure 23:
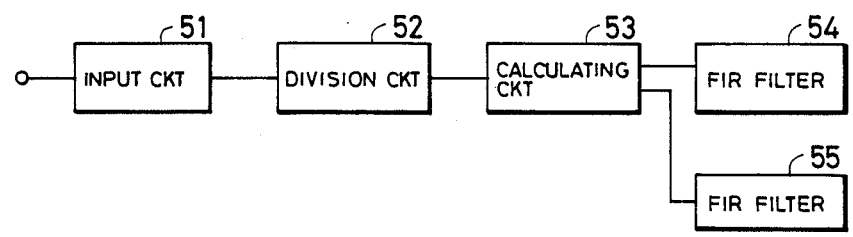
FIG. 23 is a block diagram for describing a filter-factor calculating apparatus according to a tenth embodiment of the present invention.

FIG. 23 is a block diagram showing a tenth embodiment of the present invention. In FIG. 23, illustrated at numeral 51 is an input circuit for inputting a desirable amplitude frequency property with it being separated into frequency bands corresponding to two sampling frequencies. The input circuit 51 is coupled to a division circuit 52 for dividing the inputted amplitude frequency property into frequency bands corresponding to two different sampling frequencies, which is in turn coupled to a calculating circuit 53 for obtaining the filter factors of the FIR filter corresponding to the respective frequency bands of the respective sampling frequencies. numerals 54 and 55 are respectively FIR filters whose sampling frequencies are different from each other and whose filter factors are same in number.

Figure 25:
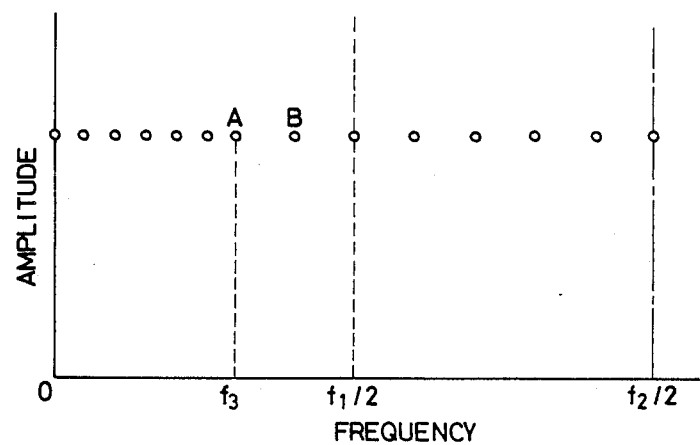
FIG. 25 shows the other input frequency property.

Operation of this embodiment will be described hereinbelow. In the input circuit 51, a desirable amplitude frequency property is divided into frequency bands corresponding to two sampling frequencies, and the overlapping portions of the frequency bands is inputted with a low frequency resolution and the non-overlapping portions thereof is inputted with a high frequency resolution. FIG. 24 shows the amplitude frequency property inputted by the input circuit 51. In (a) of FIG. 24, circle marks represent set amplitude values, characters f1 and f2 designate two different sampling frequencies. Here, the value of f2 is two times of the value of f1. The frequency resolution of the amplitude frequency property which can be inputted by the input circuit 51 is divided with f1/2 into two. At this time, the frequency resolution of the amplitude frequency property which can be inputted in the frequency band until f1/2 is f1/N where N is the number of the filter factors of the FIR filter 54 corresponding to its frequency band. On the other hand, the frequency resolution of the amplitude frequency property which can be inputted in the frequency band from f1/2 to f2/2 assumes f2/N. Here, in the case that the frequency in the vicinity of the cut-off frequency of a low-pass filter of the FIR filter 54 which acutally processes the signal with the sampling frequency f1 is f3, the frequency resolution of the amplitude frequency property which can be set between f3 and f1/2 is f2/N as shown in FIG. 25. In this embodiment, such an input method will be employed. Here, f3 is a frequency which is coincident with or near the cut-off frequency of the low-pass filter when the frequency point is determined with the resolution of frequencies from 0 to f2/N.

The amplitude frequency property inputted thus is supplied to the division circuit 52 where it is divided into frequency properties (b and c in FIG. 26) corresponding to two sampling frequencies and the numbers of the filter factors of the FIR filters 54 and 55. In (b) and (c) in FIG. 26, x-marks and Δ-marks respectively amplitude values. A division method of the amplitude frequency property in the division circuit 52 will be described hereinbelow.

First, in the band of 0 to f1/2 corresponding to the sampling frequency f1, the amplitude frequency property of 0 to f3 is inputted by the input circuit 51 with the frequency resolution f1/N and therefore this value is used as it is. The band of f3 to f1/2 of the frequency bands corresponding to the sampling frequency f1 provides a problem. Since in this band the amplitude frequency property is inputted with the frequency resolution of f2/N, it is required that a new amplitude frequency point with the f1/N frequency resolution is obtained from the value of this amplitude frequency property. Although there are various methods for obtaining this new amplitude frequency point, here, a description will be made in terms of a method using the linear interpolation. That is, when, of the amplitude and frequency values for f3 to f1/2, the value for f3 is A and the next value is B, the value C between A and B for the sampling frequency f1 can be obtained as follows because the sampling frequency f2 is twice the sampling frequency f1.

$$C=(B-A).(\tfrac{1}{2})+A$$

The other values until f1/2 can be obtained similarly. Here, although the amplitude frequency property of the frequency band corresponding to the sampling frequency f1 is obtained by means of the linear interpolation, it is also appropriate that other methods such as multi-order function method is employed instead thereof.

On the other hand, with respect to the frequencies from f4 (>f3) to f1/2, a correction is made so that the value of the amplitude frequency property of f1/2 becomes zero, and a method using this value may be employed as shown in FIG. 26. f4 is a value whereby the signal control level of the above-mentioned low-pass filter assumes a sufficient value (for example, the frequency dropped by 10 dB from the pass-band level). When the amplitude value inputted by the input circuit 51 at the frequency f4 is D, the value E at a new sampling frequency f1 can be obtained as follows and other values can be obtained similarly.

$$E=-D/(f1/2 - f4) f1/N+E$$

It is possible to further restrict the signals of the restricted bands of the previously mentioned low-pass filter. The condition that the amplitude frequency property at f1/2 is zero is also required when the filter factor is obtained under the condition of linear phase in the calculating circuit 53. Similarly, with respect to the band of the sampling frequency f2, the similar correction is made on the basis of a frequency f5 which does not affect a signal to be processed, resulting in the similar effect.

A further description will be made in terms of the amplitude frequency property at the frequency band of 0 to f2/2 corresponding to the sampling frequency f2. Since values at frequencies between f3 and f2/2 is inputted with the frequency resolution f2/N in the input circuit 51, the value can be used as it is. With respect to values at the frequencies from 0 to f3, because of being different in frequency resolution, the inputted amplitude frequency property cannot be used as it is and therefore the values at the band would be obtained in accordance with calculation. Various calculation methods are considered. Here, described is a method for thinning the inputted amplitude frequency property. That is, since f2 is two times of f1, the sampling frequency f2 between 0 to f3 and the amplitude frequency property of the filter factor N can be obtained by thinning one for two amplitude frequency properties inputted with the frequency resolution f1/N (see c of FIG. 24). Thinning allows the amplitude frequency property of the frequency band corresponding to the sampling frequency f2 to being obtained from the amplitude frequency property inputted with the frequency resolution f1/N by the input circuit 51. Although in the above case the amplitude frequency property of the frequency band corresponding to the sampling frequency f2 is obtained by means of thinning, it is also appropriate to use other methods such as method wherein the amplitude frequency property of 0 to f6 (<f3) is zero or 0 dB (=1.0).

Subsequently, in the calculating circuit 53, the filter factors of the FIR filters 54 and 55 are obtained using the two frequency properties obtained in the division circuit 52. Here, the calculation is performed, for example, such that the amplitude frequency properties of returning-down of the respective frequency bands (f1/2 to f1, f2/2 to f2) are obtained and the reverse-Fourier transformation is effected to obtain a filter factor under the conditions that, in linear phase, the amplitude frequency property is set as a real number item and the imaginary number item is zero. It is also appropriate to use a method in which the imaginary number item is not set to zero but the reverse-Fourier transformation is made with provision of an imaginary number item representing a phase frequency property or group delay property. It is further appropriate to empty a filter factor calculation method in which the minimum phase transition is effected in accordance with the relation of the Hilbert transformation. By processing thus, with respect to the frequency bands corresponding to the respective sampling frequencies, filter factors can be obtained so as to realize the inputted amplitude frequency property (or amplitude frequency property and phase frequency property or group delay property). The filter factors are inputted to the FIR filters 54 and 55 corresponding to the respective frequency bands, thereby realizing the actually inputted amplitude and frequency property.

Although in this embodiment, in the input circuit 51, the amplitude frequency property is first-kind-sampled (the frequency point is set every f1/N from the frequency 0 and every f2/N from f3), even if it is second-kind-sampled (the frequency point is set every f1/N from f1/N.½ and every f2/N from f3), the frequency division can be performed to obtain filter factors corresponding to the respective frequency bands. In this case, the slippage of the frequency points occurs due to difference of the frequency bands. However, this is removed by means of linear interpolation, multi-order function approximation or the like. Furthermore, although in this embodiment an amplitude frequency property is inputted, it is also appropriate to input other frequency property such as phase frequency property or group delay frequency property.

Figure 27:
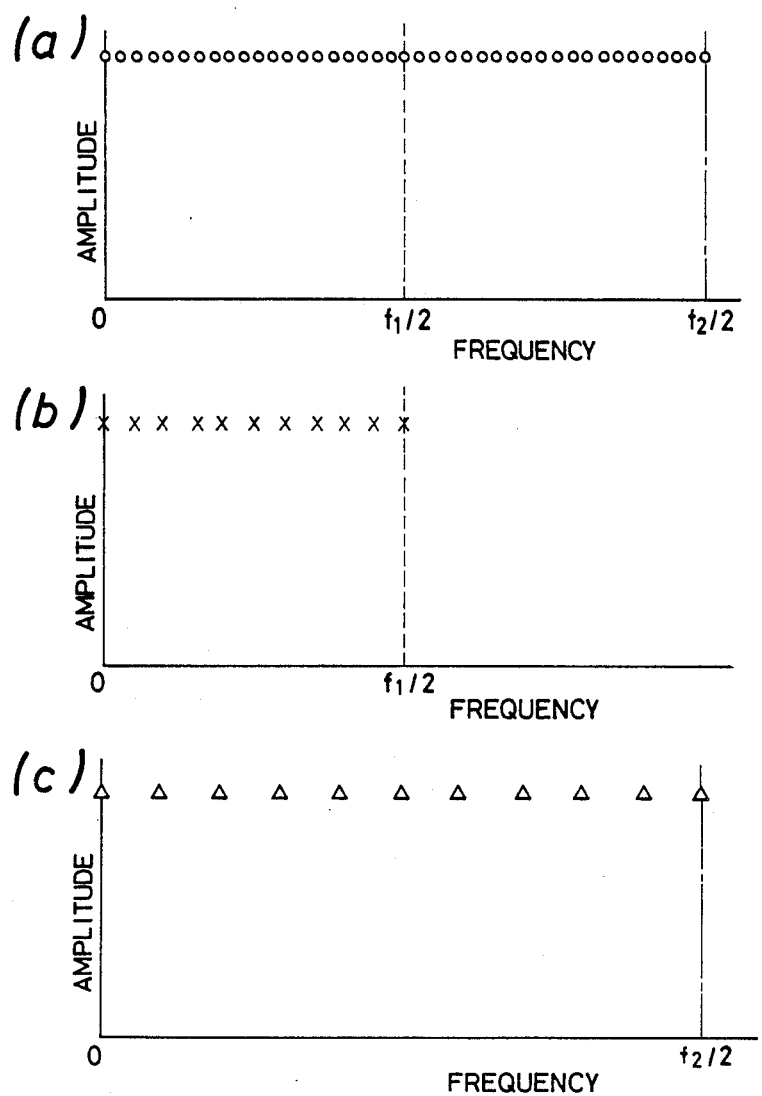
FIG. 27 is a graphic diagram showing an input frequency property and a division frequency property in eleventh embodiment of the present invention.

FIG. 27 is a graphic diagram showing an input method of an amplitude frequency property in an input circuit and a method of frequency division in a division circuit which are according to an eleventh embodiment of the present invention. An arrangement of the eleventh embodiment is similar to that of the tenth embodiment of FIG. 23 and the difference of this eleventh embodiment to the tenth embodiment is the input method and decision method.

The amplitude frequency property (a of FIG. 27) which can be inputted by an input circuit 51 is set with a frequency resolution different from the sampling frequencies f1, f2 which allow process over the entire band (in this case, f1/2N). In a division circuit 52, for obtaining a frequency point possible to process the actual signal, with respect to the frequency band corresponding to the sampling frequency of f1, operation is made so as to thin one of two frequency points inputted (see b of FIG. 27), and with respect to the frequency band corresponding to the sampling frequency of f2, operation is made so as to thin one of four frequency points inputted (see c of FIG. 27), whereby the inputted amplitude frequency property can be divided. The other operations are similar to the operations in the tenth embodiment. Even in the case that, as in the eleventh embodiment, the frequency property is set with a frequency resolution different from the frequency resolution which allows the process, the execution of an appropriate operation in the division circuit 52 results in obtaining a frequency property which can be processed, thus allowing obtaining the filter factors of FIR filters 54 and 55. Although in this embodiment the first kind sampling is performed, it is also considered to perform the second kind sampling. Furthermore, in the case that in the tenth and eleventh embodiments the first kind sampling is performed, generally, it is required to process the filter factors, obtained in a calculating circuit 3, with a window. However, it is not required to process it with the window in the case of the second kind sampling.

A twelfth embodiment of the present invention will be described hereinbelow with reference to FIG. 28 which is a block diagram showing a filter-factor calculating unit for a FIR filter.

Figure 28:
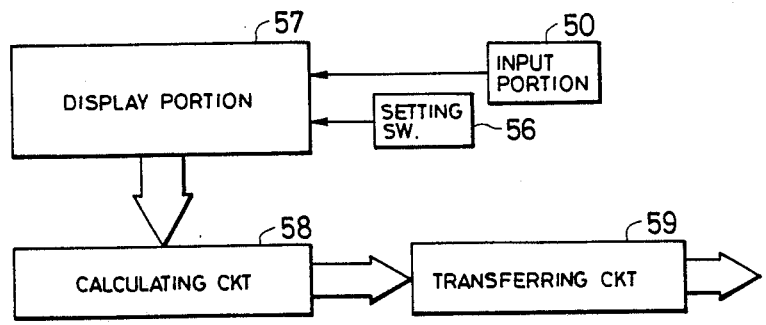
FIG. 28 is a block diagram showing a twelfth embodiment of the present invention.
Figure 29:
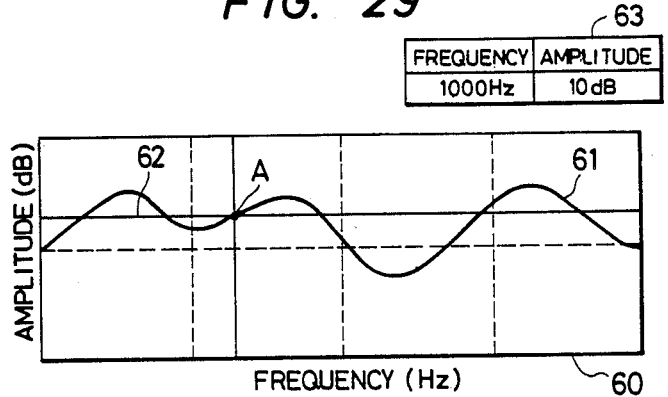
FIG. 29 is an illustration of the display portion of the twelfth embodiment.

In FIG. 28, numeral 50 is an input portion for selecting a frequency value and an amplitude value by movements upwardly, downwardly and in the left and right directions, numeral 56 is a setting switch for determining the frequency value and the amplitude value, numeral 57 represents a display portion for indicating an amplitude frequency property, the present frequency value and amplitude value with a +-mark, and the frequency value and the amplitude value with numerals, numeral 58 designates a calculating circuit for obtaining a filter factor on the basis of the set amplitude frequency property, and numeral 59 depicts a transferring circuit for transferring the filter factor to an external FIR filter. The display portion of the filter-factor calculating unit according to this embodiment is illustrated in FIG. 29. In FIG. 29, numeral 60 is a graph whose horizontal axis represents frequencies and whose vertical axis represents amplitudes, numeral 61 is an amplitude and frequency property set and indicated, numeral 62 is a +-mark arranged to be moved in accordance with movement of the input portion 50, and numeral 63 is a numeral indicating the frequency value and amplitude value corresponding to the position of the +-mark 62. The frequency value and amplitude value is set and displayed at a position of the +-mark 62 indicated by a character A. The unit of the horizontal axis is logarithm and the unit of the vertical axis is dB.

Figure 30:
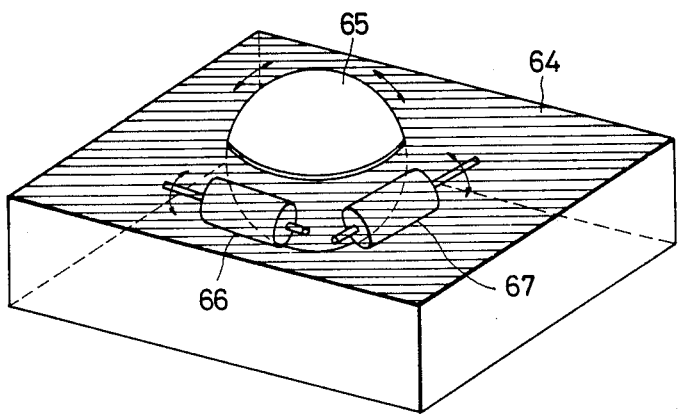
FIG. 30 is a perspective view of the input portion of the twelfth embodiment.

FIG. 30 shows an arrangement of the input portion 50 of the filter-factor calculating unit. In FIG. 30, numeral 64 is a main portion thereof, numeral 65 represents a ball, and numerals 66 and 67 are rollers, respectively. In FIG. 30, with the main portion 64 being positioned up or down, the ball 65 is rotated, or the ball 65 is rotated by movement of the main portion 64. The rotation of the ball 65 is transmitted to the rollers 66 and 67 whose rotations are converted electrically or mechanically. This conversion corresponds to the movement of the +-mark 62 of the display portion 57.

When the input portion 50 is moved, the +-mark 62 of the display portion 57 is moved in correspondence to the movement thereof and the frequency value and amplitude value corresponding to the point A which is the center (circle-mark indicated with flashing) of the +-mark 62 are displayed with numerals. The +-mark 62 is moved to the position corresponding to a frequency value and amplitude value to be set and the setting switch 56 is depressed, whereby the desirable frequency value and amplitude value corresponding to the position of the +-mark 62 are set actually. In the display portion 57, the previous frequency value and amplitude value are stored and these values and newly set values are connected with a straight line or a curved line, and when a line is indicated for the same value, the line is eliminated and a new line is indicated to set its value. The amplitude frequency property set thus is set to the calculating circuit 58. Here, a complex variable function including phase information is calculated in accordance with a method based on the Hilbert transformation or linear phase. The reverse-Fourier transformation thereof results in obtaining a filter factor of a FIR filter. The obtained filter factor is transferred by the transferring circuit 59 to the external FIR filter so that it is set thereto. Although in this embodiment the filter is a FIR filter, it is allowed that the filter is a parametric type filter. In this case, the filter factor obtained in the calculating circuit is used as a parameter (frequency, Q, gain) of each of the filters. It is appropriate that the A-point is indicated by a +-mark.

Figure 31:
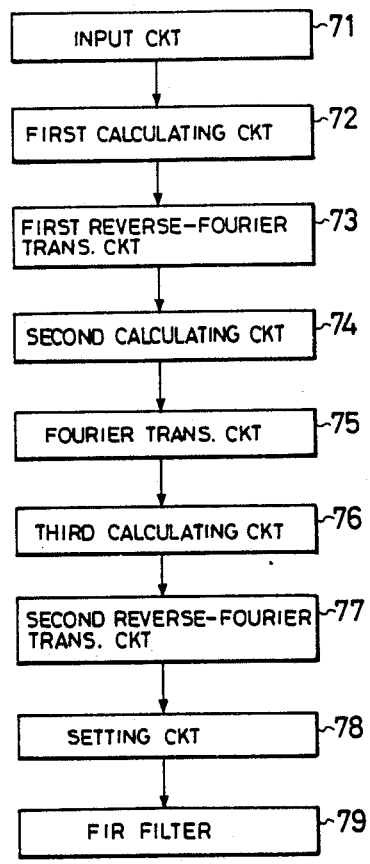
FIG. 31 is a flow chart for describing a method of a calculation and setting of a filter-factor according to the present invention.
Figure 33:
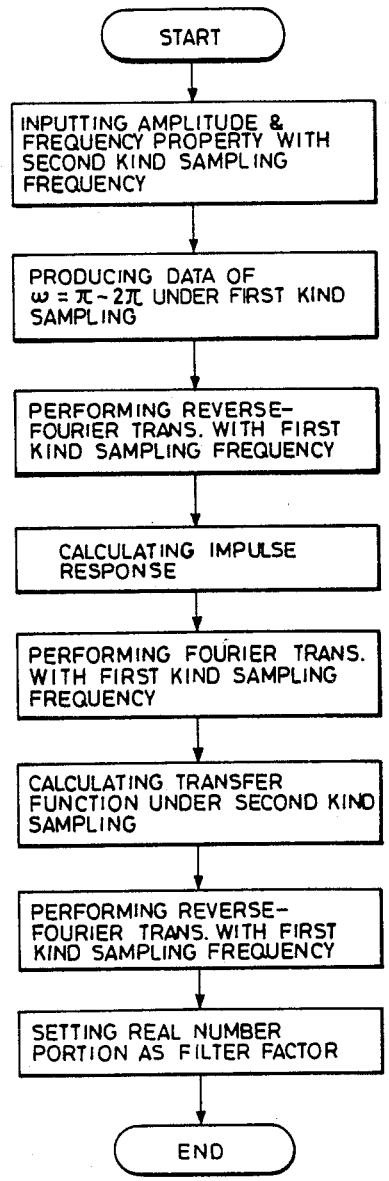
FIG. 33 is a flow chart for describing the filter-factor calculating algorithm.

A calculating method of filter factor according to this invention will be described hereinbelow with reference to FIGS. 31 to 33. FIG. 31 is a block diagram showing a calculating unit of a filter factor in which the calculating method of this invention is employed. In FIG. 31, when a desirable amplitude frequency property is inputted at every second kind sampling frequency by an input circuit 71, a first calculating circuit 72 takes a natural logarithm of the inputted amplitude frequency property and produces a property of $\omega=\pi$ to $2\pi$ under the assumption of execution of a first kind sampling. Generally, the amplitude frequency property is inputted with $\omega=0$ to $\pi$. The property obtained using the first kind sampling frequency in the first calculating circuit 72 is reverse-Fourier-transformed in a first reverse-Fourier transformation circuit 73 and a second calculating circuit 74 determines the real number portion of the value obtained in the first reverse-Fourier transformation circuits 73 as he(n) and performs calculation of $h(n)=he(n).u(n)$. The value obtained in the second calculating circuit 74 is Fourier-transformed with the first kind sampling frequency in a Fourier transformation circuit 75. Subsequently, a third calculating circuit 76 calculates $H'_R(K)=|H'(K)|.\cos(\theta(\omega))$, $H'_I(K)=|H'(K)|.\sin(\theta(\omega))$ under execution of the second kind sampling using the phase item of the imaginary number portion of the value obtained in the Fourier transformation circuit 75 so as to obtain a transfer function. The transfer function obtained in the third calculating circuit 76 is reverse-Fourier-transformed with the first kind sampling frequency in a second reverse-Fourier transformation circuit 77, and the real number portion of the impulse response obtained in the second reverse-Fourier transformation circuit 77 is set as a filter factor to a FIR filter 79 by means of a setting circuit 78.

In the input circuit 71, the desirable amplitude frequency property $|H(\omega)|$ is set at every the second kind sampling frequency (see b of FIG. 15), and in the first calculating circuit 72, a calculation is performed as follows when $\omega = (2 \cdot \pi/N)(k + 1/2)$ $$H'e(K) = \begin{cases} \ln|H(\omega)| & k = 0 \text{ to } N/2 - 1, \\ H'e(N/2 - 1), & k = N/2 \\ H'e(N - k), & k = N/2 + 1 \text{ to } N - 1 \end{cases} \quad (19)$$

where N is the number of sampling points and H'e(K) is a value to be obtained in this calculating circuit 72.

In the prior technique, this calculation has been performed as follows.

when $\omega = (2 \cdot \pi/N)(k + 1/2)$ $$H'e(K) = \ln|H(\omega)| \quad k = 0 \text{ to } N/2 - 1, \quad (20)$$
$$H'e(N - k - 1), k = N/2 \text{ to } N - 1$$

(a) of FIG. 32 shows the relation between H'e(K) in this embodiment and $|H(\omega)|$ and (b) of FIG. 32 shows the relation between H'e(K) in the prior technique and $|H(\omega)|$.

Subsequently, in the first reverse-Fourier transformation circuit 73, the reverse-Fourier transformation of H'e(K) is performed with the first kind sampling frequency as follows.

$$h'e(n) = 1/N \cdot \sum_{K=0}^{N-1} H'e(K) \cdot e^{j\omega n} \quad (21)$$
$$(\omega = 2\pi/N \cdot k, 0 \leq n \leq N - 1)$$

In the prior technique, the calculation has been made as $\omega = 2.\pi/N.(k+\frac{1}{2})$.

The second calculating circuit 74 performs the following calculation using the value obtained in accordance with the equation (21).

$$h'(n) = he'(n).u(n) \quad (22)$$

This value is Fourier-transformed in the Fourier transformation circuit 75. That is, $$H'(K) = \sum_{n=0}^{N-1} h'(n) \cdot e^{-j\omega n} \quad (23)$$
$$\omega = (2 \cdot \pi/N)k, 0 \leq k \leq N - 1$$

In the prior technique, generally, the calculation has been made as $\omega = (2./N)(k+\frac{1}{2})$.

In the third calculating circuit 76, the following calculation is effected using the imaginary number portion H'_I(K) of H'(K) obtained in the Fourier transformation circuit 75.

$$H_R(k) = \begin{cases} |H(\omega)| \cdot \cos(H'_I(k)) \\ k = 0 \text{ to } N/2 - 1 \\ H_R(N - k - 1) \\ k = N/2 \text{ to } N - 1 \end{cases} \quad (24)$$

-continued $$H_I(k) = \begin{cases} |H(\omega)| \cdot \sin(H'_I(k)) \\ k = 0 \text{ to } N/2 - 1 \\ H_I(N - k - 1) \\ k = N/2 \text{ to } N - 1 \end{cases} \quad (25)$$

where $\omega = (2\pi/N)(k+\frac{1}{2})$.

Here, the calculation corresponds to the second kind sampling.

In the second reverse-Fourier transformation circuit 77, the reverse-Fourier transformation of $H(k) = H_R(k) + jH_1(k) \ldots (26)$ is performed.

At this time, calculation is performed as follows using again the first sampling frequency.

$$h(n) = 1/N \cdot \sum_{k=1}^{N-1} H(k) \cdot e^{j\omega n} \quad (27)$$

$$\omega = (2 \cdot \pi/N)k, \quad 0 \leq n \leq N - 1$$

Here, $\omega$ of the complex variable function $e^{j\omega n}$ in the equation (27) is a value in the case of performing the first kind sampling and is not the second sampling frequency.

The setting circuit 78 derives the real number portion of the obtained impulse response h(n) and sets this value as a filter factor to the FIR filter. Here, the set h(n) is theoretically zero in the case of over N/2. However, according to the actual calculation, it is not zero because of normal errors, and therefore, the output of the setting circuit 78 is arranged so that h(n) assumes zero in the case of over N/2.

As described above, the portion, which is actually required to perform calculation using the first kind sampling frequency, is calculated using the second kind sampling frequency. Therefore, the inputted desirable amplitude and frequency property can be accurately realized without occurrence of ripples. FIG. 33 is a flow chart illustrating the above-mentioned operations of the filter factor calculating unit.

Although in the above description the amplitude frequency property is inputted with the second kind sampling frequency, in the case that the amplitude and frequency property is inputted with the first kind sampling frequency, the calculation may be made by turning the first and second kind sampling frequencies, thus resulting in similar effect.

Figure 34:
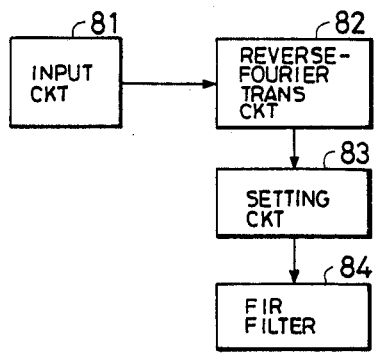
FIG. 34 is a block diagram showing a filter-factor calculating apparatus.
Figure 35:
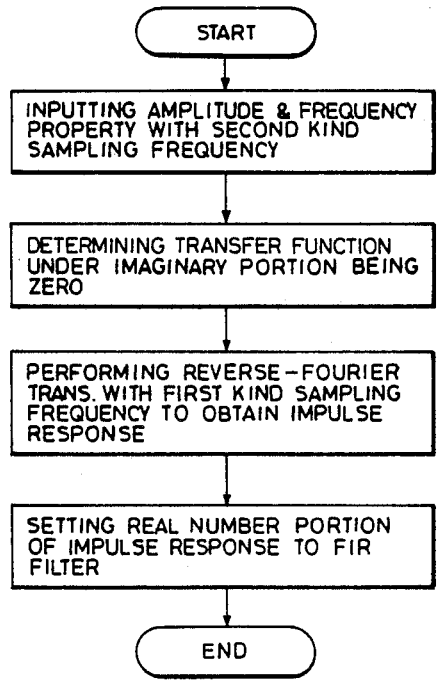
FIG. 35 is a flow chart showing the filter-factor calculating algorithm.

Another calculating method of a filter factor according to the present invention will be described with reference to FIGS. 34 and 35. FIG. 34 is a block diagram showing a filter factor calculating unit in which the filter factor calculating method is employed. In FIG. 34, when a desirable amplitude frequency property is inputted by an input circuit 81 at every the second kind sampling frequency, a reverse-Fourier transformation circuit 82 determines the inputted amplitude frequency property as a transfer function and performs the reverse-Fourier transformation thereof with the first kind sampling frequency. A setting circuit 83 set as a filter factor the real number portion of the impulse response obtained in the reverse-Fourier transformation circuit 82 to a FIR filter.

In the input circuit 81, the desirable amplitude frequency property $|H(\omega)|$ is set at every the second kind sampling frequency (see b of FIG. 15). The amplitude frequency property is treated as a transfer function $H(\omega)$. That is, $$H(\omega) = H_R(\omega) + jH_I(\omega) \quad (28)$$

$$H_R(\omega) = |H(\omega)| \quad (29)$$

$$H_I(\omega) = 0 \quad (30)$$

The transfer function $H(\omega)$ obtained thus assumes a linear phase. This will be understood from the following equations.

$$\begin{aligned} H(\omega) &= |H(\omega)| \\ &= e^{ja\omega} \cdot |H(\omega)| \cdot e^{-ja\omega} \end{aligned} \quad (31)$$

From the nature of the Fourier transformation, $$h(n+m) \longleftrightarrow e^{jm\omega} \cdot H'(\omega) \quad (32)$$

From the equations (31) and (32), the impulse response obtained under the condition that the amplitude frequency property is the transfer function $H(\omega)$ is delayed by m with respect to the impulse response obtained from the transfer function obtained in accordance with $H_R(\omega) = |H(\omega)| \cdot \cos(a\omega)$, $H_I(\omega) = -|H(\omega)| \cdot \sin(a\omega)$ where $a = (N-1)/2$. Therefore, it is understood that the transfer function assumes the linear phase. In the reverse-Fourier transformation circuit 82, on the basis of the transfer function $H(\omega)$, the reverse-Fourier transformation of the following equation (33) is performed using the first sampling frequency to obtain the impulse response corresponding to $H(\omega)$.

$$h(n) = 1/N \cdot \sum_{k=0}^{N-1} H(\omega) \cdot e^{j \cdot 2\pi/N \cdot (k \cdot n)} \quad (33)$$

where $0 \leq n \leq N-1$, $H(\omega)$ is value obtained in accordance with the equations (28), (29) and (30). Here, w of the complex variable function $e^{j\omega n}$ in the equation (31) is a value in the case of execution of the first kind sampling expressed by $\omega = (2\pi/N) \cdot k$, (k=o to N−1) and is not the second kind sampling frequency expressed by $\omega = (2\pi/N)(k+\frac{1}{2})$, (k=0 to N−1).

Here, in the case of using the second kind sampling frequency, a window will be required because a ripple is introduced into the amplitude frequency property to be realized.

Subsequently, The setting circuit 83 derives the real number portion of the impulse response h(n) obtained by the reverse-Fourier transformation circuit 82 and sets this value as a filter factor to a FIR filter 84. The inputted amplitude frequency property can be realized without occurrence of ripples. FIG. 35 is a flow chart for better understanding of the above-described operations executed in the filter factor calculating unit.

It should be understood that the foregoing relates to only preferred embodiment of the present invention, and that it is intended to cover all changes and modifications of the embodiments of the invention herein used for the purposes of the disclosures, which do not constitute departures from the spirit and scope of the invention.

What is claimed is:

1. A filter-factor calculating apparatus for a transversal filter, comprising:

inputting means for inputting a signal representing desirable frequency characteristics to obtain filter factors;

division means coupled to said inputting means for dividing the inputted frequency characteristic into a plurality of frequency bands; and calculating means coupled to said division means for obtaining filter factors for realizing a frequency characteristic of each of the divided frequency bands.

2. A filter-factor calculating apparatus as claimed in claim 1, wherein the desirable frequency characteristic is one of an amplitude frequency property, a phase frequency property, a group delay frequency property and a group delay distortion frequency property.

3. A filter-factor calculating apparatus as claimed in claim 1, wherein said inputting means inputs the frequency property with a frequency resolution responsive to the number of said filter factors.

4. A filter-factor calculating apparatus as claimed in claim 1, wherein said inputting means, with respect to overlapping portions of the frequency bands corresponding to respective sampling frequencies, inputs the frequency property with a smaller one of the frequency resolutions responsive to the numbers of the filter factors for the respective frequency bands, and said division means, in response to the frequency bands being overlapped, obtains a frequency property of the greater frequency resolution from the frequency property with the smaller frequency resolution for achieving the division of the frequency properties.

5. A filter-factor calculating apparatus as claimed in claim 1, wherein, in the vicinity of the boundary of overlapping portions of the frequency bands corresponding to respective sampling frequencies, said inputting means inputs the frequency properties with greater frequency resolutions corresponding to the numbers of the filter factors for the respective frequency bands, and said division means obtains, of the frequency properties with the smaller frequency resolutions, a frequency property in the vicinity of the boundary of an overlapping portion to the other frequency band on the basis of the inputted frequency property with the greater frequency resolution for performing of the division of the frequency property.

6. A filter-factor calculating apparatus as claimed in claim 1, wherein said inputting means inputs the frequency property with a frequency resolution irrespective of the number of the filter factors and performs a calculation so that the inputted frequency property assumes a value based on a frequency resolution responsive to the number of the filter factors.

7. A filter-factor calculating apparatus as claimed in claim 1, wherein said inputting means performs a first kind of sampling in which sampling points are taken at every frequency resolution from the frequency of 0, the frequency resolutions housing determined on the basis of the sampling frequencies and the filter factors.

8. A filter-factor calculating apparatus as claimed in claim 1, wherein said inputting means performs a second kind of sampling in which frequency sampling points are taken every frequency resolution from a frequency which is half a frequency resolution based upon the sampling frequency and the filter factor.

9. A filter-factor calculating apparatus as claimed in claim 1, wherein said inputting means inputs the frequency property in no connection with a first kind of sampling and a second kind of sampling and said division means obtains the first or second kind of sampling points on the basis of the frequency property inputted by said inputting means.

10. A filter-factor calculating apparatus as claimed in claim 1, wherein said inputting means, when the frequency property set by said division means is in accordance with the first kind sampling, obtains a filter factor by multiplying the filter factor obtained by said calculating means by a window function.

11. A filter-factor calculating apparatus as claimed in claim 1, wherein said division means performs a correction for a division so that the frequency property becomes zero from a frequency over the high cut-off frequency of a band-pass filter for effecting the frequency division of a signal inputted to the transversal filter toward the Nyquist frequency of the frequency band corresponding to the transversal filter, the Nyquist frequency being ½ of the sampling frequency.

12. A filter-factor calculating apparatus as claimed in claim 1, wherein said division means, for a division, performs a correction so that the frequency property becomes zero with respect to Nyquist frequency of the frequency band corresponding to one of a plurality of different sampling frequencies, the Nyquist frequency being half the sampling frequency.

13. A filter-factor calculating apparatus as claimed in claim 1, wherein said calculating means has a first transformation means for performing a Hilbert transformation or a linear phase transformation with respect to the respective frequency properties divided by said division means.

14. A filter-factor calculating apparatus as claimed in claim 13, wherein said calculating means has a inverse-Fourier transformation means for performing the reverse-Fourier transformation of the property obtained by said first transformation means.

15. A filter-factor calculating apparatus as claimed in claim 1, further comprising:

inputting means for inputting a signal representing desirable amplitude frequency property to obtain a filter factor;

band-division means for dividing the band of the inputted amplitude frequency property into a plurality of bands and for thinning sampling points;

first transformation means for performing a Hilbert transformation or a linear phase transformation with respect to the amplitude frequency of each of the bands divided by said band-division means;

second transformation means for performing a reverse-Fourier transformation with respect to the property transformed by said first transmission means; and transferring means for directly or indirectly transferring the filter factor obtained by said second transformation means.

16. A filter-factor calculating apparatus as claimed in claim 15, further comprising:

sampling frequency transformation means for performing a process such that sampling frequencies of filter factors obtained by said reverse-Fourier transformation means with respect to each of the divided frequency bands are coincident with each other;

band-pass filter means for outputting only a signal of the band from each of the outputs of said sampling frequency transformation means; and addition means for performing the addition of the filter factor obtained with respect to each of the bands, wherein the added filter factors are transferred by said transferring means.

17. A filter-factor calculating apparatus for an external filter comprising:

inputting means including amplitude inputting means for inputting a signal representing a desirable amplitude frequency property and phase inputting means for inputting a desirable phase frequency property, so as to obtain a filter factor;

reverse-Fourier transformation means for obtaining an impulse response corresponding to a transfer function having the inputted amplitude frequency property and the inputted phase and frequency property; and setting means for setting an external filter to the impulse response obtained by the reverse-Fourier transformation, as said filter factor.

18. A filter-factor calculating apparatus as claimed in claim 17, wherein said inputting means has correction amplitude inputting means for inputting a desirable amplitude frequency property and calculating means for obtaining the phase frequency property in accordance with a relation of the Hilbert transformation on the basis of the correction amplitude frequency property inputted by said correction amplitude inputting means, the filter factor being obtained by said reverse-Fourier transformation means on the basis of a transfer function having the amplitude frequency property inputted by said amplitude inputting means and the phase frequency property obtained by said calculating means.

19. A filter-factor calculating apparatus as claimed in claim 17, wherein said phase inputting means comprises group delay inputting means for inputting a group delay frequency property or group delay distortion frequency property and integrating means for calculating the phase and frequency property by integrating the group delay frequency property or group delay distortion frequency property, the filter factor being obtained by said reverse-Fourier transformation means on the basis of the amplitude frequency property and the phase frequency property obtained by said calculating means.

20. A filter-factor calculating apparatus as claimed in claim 17, wherein said phase inputting means inputs only the phase frequency property in the range of $\omega$ (angular frequency)=0 to $\pi$ and produces the phase frequency property in the range of $\omega = \pi$ to $2\pi$ by turning the positive and negative signs of the inputted phase frequency property and further by turning said inputted phase frequency property down to produce the overall phase frequency property.

21. A filter-factor calculating apparatus as claimed in claim 17, wherein said amplitude inputting means inputs only the amplitude frequency property in the range of $\omega$ (angular frequency)=0 to $\pi$ and produces the amplitude frequency property in the range of $\omega = \pi$ to $2\pi$ by turning down the inputted amplitude frequency property to produce the overall amplitude frequency property.

22. A filter-factor calculating apparatus as claimed in claim 17, further comprising window means for multiplying a window by the impulse response obtained by said reverse-Fourier transformation means, the impulse response obtained by multiplying the window being using as the filter factor.

23. A filter-factor calculating apparatus as claimed in claim 17, wherein said inputting means inputs the amplitude frequency property with a second kind sampling frequency, said reverse-Fourier transformation means obtains the impulse response by performing the reverse-Fourier transformation with a first kind sampling frequency with respect to a transfer function calculated with the first sampling frequency under the condition of linear phase using the inputted amplitude frequency property.

24. A filter-factor calculating apparatus as claimed in claim 17, further comprising display means having a mark moved in response to movement, the horizontal position of said mark representing a frequency value and the vertical position thereof representing an amplitude value, further comprising set means having a second mark for indicating the position of said first-mentioned mark.

25. A filter-factor calculating apparatus as claimed in claim 24, said set means stores the previously set frequency value and amplitude value and, in the case of setting of new frequency value and amplitude value, connects respective positions thereof with a straight line or curved line for indication.

26. A filter-factor calculating apparatus as claimed in claim 24, wherein said set means, when the line indicated already is coincident in frequency value and amplitude value with a newly indicated line, deletes the already indicated line to set new values.

27. A filter-factor calculating apparatus as claimed in claim 24, wherein said set means indicates the set frequency value and amplitude value with numerals.

28. A filter-factor calculating apparatus as claimed in claim 24, wherein said first mark has a $+$-configuration and said second has a circle or cross configuration.

29. A filter-factor calculating apparatus as claimed in claim 17, wherein the filter factor to be obtained is a filter factor for a FIR type filter or an IIR type filter or is a parameter (frequency, Q, gain) for parametric type filter.

30. A filter-factor calculating and setting method comprising the steps of:

inputting an amplitude frequency property with a first kind of second kind sampling frequency by means of an inputting circuit;

obtaining a transfer function in accordance with a combination of the first kind sampling frequency and the second kind sampling frequency using the relation to the Hilbert transformation on the basis of the inputted amplitude frequency property;

performing a reverse-Fourier transformation of the transfer function with the second kind sampling frequency in response to the amplitude frequency property being set to said inputting circuit with the first kind sampling frequency and, performing the reverse-Fourier transformation of the transfer function with the first kind sampling frequency in response to the amplitude frequency property being set to said inputting circuit with the second kind of sampling frequency, so as to obtain an impulse response; and setting the real number portion of the obtained impulse response as a filter factor to an external transversal filter.

31. A filter-factor calculating and setting method comprising the steps of:

inputting an amplitude frequency property with a first kind or second kind sampling frequency by means of an inputting circuit;

obtaining a transfer function on the basis of the inputted amplitude frequency property;

performing the reverse-Fourier transformation of the transfer function with the second kind sampling frequency in response to the amplitude frequency property being set to said inputting circuit with the first kind sampling frequency and, performing the reverse-Fourier transformation of the transfer function with the first kind sampling frequency in response to the amplitude frequency property being set to said inputting circuit, so as to obtain an impulse response; and setting the real number portion of the obtained impulse response as a filter factor to an external transversal filter.

* * * * *